US011899167B2

(12) United States Patent
Nishio et al.

(10) Patent No.: US 11,899,167 B2
(45) Date of Patent: *Feb. 13, 2024

(54) POLYESTER FILM, LAMINATED FILM, AND USE THEREOF

(71) Applicant: TOYOBO CO., LTD., Osaka (JP)

(72) Inventors: Shotaro Nishio, Tsuruga (JP); Kiwamu Kawai, Tsuruga (JP); Akira Shimizu, Tsuruga (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/614,201

(22) PCT Filed: May 14, 2020

(86) PCT No.: PCT/JP2020/019265
§ 371 (c)(1),
(2) Date: Nov. 24, 2021

(87) PCT Pub. No.: WO2020/241279
PCT Pub. Date: Dec. 3, 2020

(65) Prior Publication Data
US 2022/0252763 A1 Aug. 11, 2022

(30) Foreign Application Priority Data

May 28, 2019 (JP) ................. 2019-099159
May 28, 2019 (JP) ................. 2019-099162

(51) Int. Cl.
G02B 1/14 (2015.01)
C09J 7/29 (2018.01)
(Continued)

(52) U.S. Cl.
CPC ............. *G02B 1/14* (2015.01); *C09J 7/255* (2018.01); *C09J 7/29* (2018.01); *G02B 1/04* (2013.01);
(Continued)

(58) Field of Classification Search
CPC ............. B32B 7/00–7/14; B32B 27/36; G02B 1/00–1/18; G02B 5/3025–5/3075
See application file for complete search history.

(56) References Cited

U.S. PATENT DOCUMENTS

| 4,561,724 A | 12/1985 | Otaki et al. |
| 5,429,855 A | 7/1995 | Kotani et al. |

(Continued)

FOREIGN PATENT DOCUMENTS

| CN | 1760703 A | 4/2006 |
| CN | 1967294 A | 5/2007 |

(Continued)

OTHER PUBLICATIONS

Japanese Patent Office, International Search Report in International Patent Application No. PCT/JP2020/019264 (dated Jul. 21, 2020).

(Continued)

*Primary Examiner* — Prashant J Khatri
(74) *Attorney, Agent, or Firm* — Leydig, Voit & Mayer, Ltd.

(57) ABSTRACT

Provided are a polyester film, a laminated film, and the like for protecting an organic EL module of a foldable display each of which is free of occurrence of a crack at a folding portion thereof, in order to provide a foldable display excellent in mass productivity, and free of a risk of causing distortion in an image displayed at a folding portion thereof after being repeatedly folded. The polyester film for protecting an organic EL module of a foldable display satisfies the following conditions: (1) a refractive index in a bending (Continued)

direction is from 1.590 to 1.620; (2) a refractive index in a folding portion direction is from 1.670 to 1.700; (3) a refractive index in a thickness direction is 1.520 or less; and (4) a density is 1.380 g/cm³ or more, wherein the bending direction refers to a direction orthogonal to a folding portion of the polyester film at a time when the polyester film is folded.

16 Claims, 2 Drawing Sheets

(51) Int. Cl.
C09J 7/25 (2018.01)
G02B 1/04 (2006.01)
H04M 1/02 (2006.01)
H10K 50/84 (2023.01)
H10K 102/00 (2023.01)

(52) U.S. Cl.
CPC .......... H04M 1/0268 (2013.01); H10K 50/84 (2023.02); C09J 2203/326 (2013.01); C09J 2467/006 (2013.01); H10K 2102/311 (2023.02)

(56) References Cited

U.S. PATENT DOCUMENTS

| | | | |
|---|---|---|---|
| 5,833,880 A | 11/1998 | Siemensmeyer et al. | |
| 2002/0034709 A1 | 3/2002 | Fukuda et al. | |
| 2002/0036285 A1 | 3/2002 | Prechtl et al. | |
| 2003/0072893 A1 | 4/2003 | Nakano et al. | |
| 2004/0028925 A1 | 2/2004 | Kusume et al. | |
| 2004/0075080 A1 | 4/2004 | Prechtl et al. | |
| 2004/0212767 A1 | 10/2004 | Sasaki et al. | |
| 2005/0099562 A1 | 5/2005 | Nishikouji et al. | |
| 2006/0077320 A1 | 4/2006 | Hata et al. | |
| 2006/0210709 A1 | 9/2006 | Shutou | |
| 2008/0193747 A1 | 8/2008 | MacDonald et al. | |
| 2008/0233312 A1* | 9/2008 | Nakamura | G02B 1/14 428/1.31 |
| 2009/0068472 A1 | 3/2009 | Umemoto et al. | |
| 2009/0137761 A1 | 5/2009 | Irisawa et al. | |
| 2009/0247782 A1 | 10/2009 | Irisawa et al. | |
| 2009/0269513 A1 | 10/2009 | Nishiyama et al. | |
| 2009/0275742 A1 | 11/2009 | Sano et al. | |
| 2011/0315306 A1 | 12/2011 | Goto et al. | |
| 2012/0052197 A1 | 3/2012 | Sawada et al. | |
| 2012/0055607 A1 | 3/2012 | Kitagawa et al. | |
| 2012/0055608 A1 | 3/2012 | Kitagawa et al. | |
| 2012/0055621 A1 | 3/2012 | Goto et al. | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058291 A1 | 3/2012 | Kitagawa et al. | |
| 2012/0058321 A1 | 3/2012 | Goto et al. | |
| 2012/0107605 A1 | 5/2012 | Ozawa et al. | |
| 2012/0229732 A1 | 9/2012 | Koike et al. | |
| 2012/0327512 A1 | 12/2012 | Goto et al. | |
| 2013/0100529 A1 | 4/2013 | Kitagawa et al. | |
| 2013/0114139 A1 | 5/2013 | Kitagawa et al. | |
| 2014/0016198 A1 | 1/2014 | Sawada et al. | |
| 2014/0044947 A1 | 2/2014 | Sawada et al. | |
| 2014/0104519 A1 | 4/2014 | Murata et al. | |
| 2014/0186568 A1 | 7/2014 | Kitagawa et al. | |
| 2015/0183199 A1 | 7/2015 | Kitagawa et al. | |
| 2015/0369981 A1* | 12/2015 | Takeda | G02B 5/3025 359/488.01 |
| 2016/0025910 A1 | 1/2016 | Sawada et al. | |
| 2016/0035801 A1 | 2/2016 | Kim | |
| 2016/0054494 A1 | 2/2016 | Kitagawa et al. | |
| 2016/0062012 A1 | 3/2016 | Shin et al. | |
| 2016/0103258 A1 | 4/2016 | Kitagawa et al. | |
| 2016/0318845 A1 | 11/2016 | Katoh et al. | |
| 2017/0276840 A1 | 9/2017 | Horio et al. | |
| 2018/0088392 A1 | 3/2018 | Park et al. | |
| 2018/0217639 A1 | 8/2018 | Jones et al. | |
| 2018/0356564 A1 | 12/2018 | Jeong et al. | |
| 2019/0004367 A1 | 1/2019 | Koike et al. | |
| 2019/0177577 A1 | 6/2019 | Yamasaki et al. | |
| 2019/0219740 A1 | 7/2019 | Horio et al. | |
| 2019/0255807 A1 | 8/2019 | Isojima et al. | |
| 2020/0269559 A1 | 8/2020 | Inagaki et al. | |
| 2021/0179901 A1 | 6/2021 | Fujita et al. | |
| 2022/0085307 A1 | 3/2022 | Nishio et al. | |
| 2022/0164003 A1 | 5/2022 | Nishio et al. | |
| 2022/0213350 A1 | 7/2022 | Nishio et al. | |
| 2022/0227950 A1 | 7/2022 | Nishio et al. | |
| 2022/0236467 A1 | 7/2022 | Nishio et al. | |
| 2022/0236468 A1 | 7/2022 | Nishio et al. | |
| 2022/0246069 A1 | 8/2022 | Nishio et al. | |

FOREIGN PATENT DOCUMENTS

| | | |
|---|---|---|
| CN | 101160674 A | 4/2008 |
| CN | 101923245 A | 12/2010 |
| CN | 104067352 A | 9/2014 |
| CN | 104159735 A | 11/2014 |
| CN | 105321978 A | 2/2016 |
| CN | 106488839 A | 3/2017 |
| CN | 107867030 A | 4/2018 |
| CN | 109789691 A | 5/2019 |
| EP | 3922668 A1 | 12/2021 |
| JP | S60-097323 A | 5/1985 |
| JP | S60-203422 A | 10/1985 |
| JP | S61-009619 A | 1/1986 |
| JP | S63-001357 B2 | 1/1988 |
| JP | S63-301850 A | 12/1988 |
| JP | H05-049710 B2 | 7/1993 |
| JP | H10-316783 A | 12/1998 |
| JP | H11-513360 A | 11/1999 |
| JP | 2001-324603 A | 11/2001 |
| JP | 2001-350021 A | 12/2001 |
| JP | 2002-030042 A | 1/2002 |
| JP | 2002-178400 A | 6/2002 |
| JP | 2002-229039 A | 8/2002 |
| JP | 2002-265541 A | 9/2002 |
| JP | 2002-303722 A | 10/2002 |
| JP | 2002-308832 A | 10/2002 |
| JP | 2002-317013 A | 10/2002 |
| JP | 2003-089151 A | 3/2003 |
| JP | 2003-520878 A | 7/2003 |
| JP | 2004-204190 A | 7/2004 |
| JP | 2004-529220 A | 9/2004 |
| JP | 2004-299101 A | 10/2004 |
| JP | 2005-154566 A | 6/2005 |
| JP | 2005-263789 A | 9/2005 |
| JP | 2005-331909 A | 12/2005 |
| JP | 2006-285197 A | 10/2006 |
| JP | 2007-016207 A | 1/2007 |
| JP | 2007-076839 A | 3/2007 |
| JP | 2007-094071 A | 4/2007 |
| JP | 2007-510946 A | 4/2007 |
| JP | 2007-119415 A | 5/2007 |
| JP | 2007-121721 A | 5/2007 |
| JP | 2007-126628 A | 5/2007 |
| JP | 2007-133184 A | 5/2007 |
| JP | 2007-138138 A | 6/2007 |
| JP | 2007-140465 A | 6/2007 |
| JP | 2007-156439 A | 6/2007 |
| JP | 2007-186430 A | 7/2007 |
| JP | 2008-149577 A | 7/2008 |
| JP | 2009-093074 A | 4/2009 |
| JP | 2009-109831 A | 5/2009 |
| JP | 2009-149066 A | 7/2009 |
| JP | 2009-199087 A | 9/2009 |
| JP | 2010-168570 A | 8/2010 |
| JP | 2010-228391 A | 10/2010 |
| JP | 2011-002816 A | 1/2011 |

(56) References Cited

FOREIGN PATENT DOCUMENTS

| | | |
|---|---|---|
| JP | 2011-154134 A | 8/2011 |
| JP | 2012-073563 A | 4/2012 |
| JP | 2012-107080 A | 6/2012 |
| JP | 2013-033248 A | 2/2013 |
| JP | 2013-101328 A | 5/2013 |
| JP | 2013-114131 A | 6/2013 |
| JP | 2013-184431 A | 9/2013 |
| JP | 2013-210624 A | 10/2013 |
| JP | 2014-065887 A | 4/2014 |
| JP | 2014-186210 A | 10/2014 |
| JP | 2014-206682 A | 10/2014 |
| JP | 2014-221560 A | 11/2014 |
| JP | 2015-007702 A | 1/2015 |
| JP | 2015-064418 A | 4/2015 |
| JP | 2015-129210 A | 7/2015 |
| JP | 2015-163596 A | 9/2015 |
| JP | 2015-174357 A | 10/2015 |
| JP | 2015-232120 A | 12/2015 |
| JP | 2016-004055 A | 1/2016 |
| JP | 2016-090925 A | 5/2016 |
| JP | 2016-155124 A | 9/2016 |
| JP | 2017-033033 A | 2/2017 |
| JP | 2017-033034 A | 2/2017 |
| JP | 2017-067819 A | 4/2017 |
| JP | 2017-134416 A | 8/2017 |
| JP | 2018-010086 A | 1/2018 |
| JP | 2018-022060 A | 2/2018 |
| JP | 2018-027995 A | 2/2018 |
| JP | 2018-059070 A | 4/2018 |
| JP | 2018-072663 A | 5/2018 |
| JP | 2018-124367 A | 8/2018 |
| JP | 2018-538572 A | 12/2018 |
| TW | 201839476 A | 11/2018 |
| WO | WO 2001/053384 A1 | 7/2001 |
| WO | WO 2002/062873 A1 | 8/2002 |
| WO | WO 2005/045485 A1 | 5/2005 |
| WO | WO 2006/100830 A1 | 9/2006 |
| WO | WO 2010/100917 A1 | 9/2010 |
| WO | WO 2011/058774 A1 | 5/2011 |
| WO | WO 2013/100042 A1 | 7/2013 |
| WO | WO 2016/010134 A1 | 1/2016 |
| WO | WO 2017/115736 A1 | 7/2017 |
| WO | WO 2018/150940 A1 | 8/2017 |
| WO | WO 2018/003963 A1 | 1/2018 |
| WO | WO 2018/150940 A1 | 8/2018 |
| WO | WO 2018/159285 A1 | 9/2018 |
| WO | WO 2019/026753 A1 | 2/2019 |
| WO | WO 2020/162119 A1 | 8/2020 |
| WO | WO 2020/162120 A1 | 8/2020 |
| WO | WO 2020/241278 A1 | 12/2020 |
| WO | WO 2020/241280 A1 | 12/2020 |
| WO | WO 2020/241281 A1 | 12/2020 |
| WO | WO 2020/241312 A1 | 12/2020 |
| WO | WO 2020/241313 A1 | 12/2020 |

OTHER PUBLICATIONS

Japanese Patent Office, International Search Report in International Patent Application No. PCT/JP2020/019265 (dated Jul. 21, 2020).
Japanese Patent Office, International Search Report in International Patent Application No. PCT/JP2020/019266 (dated Jul. 28, 2020).
Japanese Patent Office, International Search Report in International Patent Application No. PCT/JP2020/019267 (dated Jul. 21, 2020).
Lub et al., "The synthesis of liquid-crystalline diacrylates derived from cyclohexane units," *Recl. Trav. Chim. Pays-Bas*, 115(6): 321-328 (1996).
Japanese Patent Office, International Search Report in International Patent Application No. PCT/JP2020/019484 (dated Jul. 28, 2020).
Japanese Patent Office, International Search Report in International Patent Application No. PCT/JP2020/019485 (dated Jul. 14, 2020).
European Patent Office, Extended European Search Report in European Application No. 20815576.2 (dated May 9, 2023).
U.S. Appl. No. 17/429,119, filed Aug. 6, 2021, Pending.
U.S. Appl. No. 17/429,147, filed Aug. 6, 2021, Pending.
U.S. Appl. No. 17/614,154, filed Nov. 24, 2021, Pending.
U.S. Appl. No. 17/614,228, filed Nov. 24, 2021, Pending.
U.S. Appl. No. 17/614,260, filed Nov. 24, 2021, Pending.
U.S. Appl. No. 17/615,426, filed Nov. 30, 2021, Pending.
U.S. Appl. No. 17/615,433, filed Nov. 30, 2021, Pending.
European Patent Office, Extended European Search Report in European Application No. 20815504.4 (dated May 15, 2023).
European Patent Office, Extended European Search Report in European Patent Application No. 20753154.2 (dated Oct. 10, 2022).
European Patent Office, Extended European Search Report in European Patent Application No. 20752680.7 (dated Oct. 26, 2022).
Japanese Patent Office, International Search Report in International Patent Application No. PCT/JP2020/001043 (dated Mar. 24, 2020).
Japanese Patent Office, International Search Report in International Patent Application No. PCT/JP2020/001044 (dated Mar. 24, 2020).
Yang, "Review of Operating Principle and Performance of Polarizer-Free Reflective Liquid-Crystal Displays," *Journal of the Society for Information Display*, 16(1): 117-124 (2012).
Wikipedia, "Cyclic Olefin Copolymer" (2023) [accessed at https://en.wikipedia.org/wiki/Cyclic_olefin_copolymer].
European Patent Office, Extended European Search Report in European Patent Application No. 20814476.6 (dated Jun. 12, 2023).
European Patent Office, Extended European Search Report in European Patent Application No. 20815401.3 (dated Jun. 12, 2023).

* cited by examiner

POLYESTER FILM, LAMINATED FILM, AND USE THEREOF

TECHNICAL FIELD

The present invention relates to a polyester film for protecting an organic EL module of a foldable display, a laminated film for protecting an organic EL module of a foldable display, a foldable display, and a mobile device, and more specifically, to a polyester film for protecting an organic EL module, which hardly causes image distortion due to deformation of the film even when repeatedly folded, and a laminated film for protecting an organic EL module of a foldable display, a foldable display, and a mobile device each using the film.

BACKGROUND ART

Becoming thinner and lighter, a mobile device, such as a smartphone, has become widely prevalent. While being required to have a variety of functions, the mobile device is also required to be convenient in use. It is taken for granted that a prevailing mobile device can be operated with one hand for simple tasks, and can be put into a clothes pocket. Thus, such mobile device needs to have a small screen size, such as about 6 inches.

Meanwhile, a tablet device having a screen size of from 7 inches to 10 inches is intended for use not only for video content and music, but also for business and drawing purposes, reading, and the like, and thus has a high level of functionality. However, the tablet device cannot be operated with one hand and is not particularly portable, leaving some issues in regard to convenience.

In order to meet the requirements described above, there is a proposal of a technique involving making a compact device by connecting a plurality of displays (see PTL 1). However, due to the remaining bezel portion, the image is cut up, and the visibility becomes low. Thus, this technique is not commonly used.

In recent years, a mobile device including a flexible display or a foldable display has been proposed. This technique enables one to conveniently carry a mobile device including a large-screen display without image-cutting problems.

The related-art display and mobile device that have no folding structure can be protected by a non-flexible material, such as glass, applied to the surface of the display. However, a foldable display using a single screen that spans over a folding portion needs to be protected by a flexible and surface-protectable hard coating film or the like. However, for example, there has been a problem in that the foldable display is repeatedly folded at a certain point that is a folding portion, and hence the film at the point deforms over time, causing image distortion on the display. In addition, not only a surface protective film, films are used in various portions of the foldable display, such as a polarizing plate, a retardation plate, a touchscreen substrate, a substrate of a display cell of organic electroluminescence (EL) or the like, and a back-surface protective member, and these films have also been required to have durability against repeated folding.

There is also a proposal of a technique involving partially altering a film thickness (see PTL 2). However, this method is not suitable for mass production.

In addition, there is also a proposal of a technique involving adjusting a refractive index of a polyester film in its bending direction (see PTL 3). However, there has been a problem in that, as the refractive index in the bending direction is decreased, pencil hardness at the time of hard coating application reduces, resulting in a reduction in function of protecting the surface of the display. There has also been a problem in that, as the refractive index in one direction is decreased, although deformation at the time of folding is ameliorated, uniaxial orientation of a folding direction is enhanced, with the result that a folding portion is cracked or fractured.

CITATION LIST

Patent Literature

PTL 1: JP 2010-228391 A
PTL 2: JP 2016-155124 A
PTL 3: WO 2018/150940 A1

SUMMARY OF INVENTION

Technical Problem

The present invention is intended to solve the problems that arise in related-art display members as described above, and is intended to provide a polyester film for protecting an organic EL module of a foldable display, and a laminated film for protecting an organic EL module of a foldable display each of which is free of occurrence of a fold mark or a crack at a folding portion thereof, in order to provide a foldable display excellent in mass productivity, and free of a risk of causing distortion in an image displayed at a folding portion thereof after being repeatedly folded, and a mobile device including such foldable display.

Solution to Problem

Specifically, the present invention includes the following configurations.

Item 1.

A polyester film for protecting an organic EL module of a foldable display, the polyester film satisfying the following conditions:

(1) a refractive index in a bending direction is from 1.590 to 1.620;
(2) a refractive index in a folding portion direction is from 1.670 to 1.700;
(3) a refractive index in a thickness direction is 1.520 or less; and
(4) a density is 1.380 g/cm$^3$ or more,
wherein the bending direction refers to a direction orthogonal to a folding portion of the polyester film at a time when the polyester film is folded.

Item 2.

The polyester film for protecting an organic EL module of a foldable display according to Item 1, wherein the polyester film has an elastic modulus in the bending direction of 2.7 GPa or less, and an elastic modulus in the folding portion direction of 4.5 GPa or more.

Item 3.

The polyester film for protecting an organic EL module of a foldable display according to Item 1 or 2, wherein the polyester film has a total light transmittance of 85% or more, a haze of 3% or less, and a maximum heat shrinkage ratio of 6% or less.

Item 4.

The polyester film for protecting an organic EL module of a foldable display according to any one of Items 1 to 3, wherein the polyester film includes an easy-to-adhere layer on at least one surface thereof.

Item 5.

The polyester film for protecting an organic EL module of a foldable display according to any one of Items 1 to 4, wherein the polyester film includes a hard coating layer having a thickness of from 1 μm to 50 μm on at least one surface thereof.

Item 6.

A laminated film for protecting an organic EL module of a foldable display, the laminated film including: the polyester film of any one of Items 1 to 3; and an adhesive layer on at least one surface of the polyester film.

Item 7.

The laminated film for protecting an organic EL module of a foldable display according to Item 6, wherein the adhesive layer has a thickness of from 1 μm to 50 μm.

Item 8.

The laminated film for protecting an organic EL module of a foldable display according to Item 6 or 7, wherein the polyester film includes an easy-to-adhere layer on at least one surface thereof.

Item 9.

A laminated film for protecting an organic EL module of a foldable display, the laminated film including: the laminated film for protecting an organic EL module of a foldable display of any one of Items 6 to 8; and a hard coating layer having a thickness of from 1 μm to 50 μm arranged on the polyester film on an opposite side to a side of the laminated film having the adhesive layer.

Item 10.

A foldable display including the polyester film for protecting an organic EL module of a foldable display of any one of Items 1 to 5 as a protective film of an organic EL module, wherein the protective film of the organic EL module is a single film continuous across a folding portion of the foldable display.

Item 11.

A foldable display including the laminated film for protecting an organic EL module of a foldable display of any one of Items 6 to 9 as a protective film of an organic EL module, wherein the protective film of the organic EL module is a single film continuous across a folding portion of the foldable display.

Item 12.

A mobile device including the foldable display of item 10 or 11.

Advantageous Effects of Invention

While the foldable display using the polyester film for protecting an organic EL module of a foldable display or the laminated film for protecting an organic EL module of a foldable display of the present invention maintains mass productivity, the laminated film is free of occurrence of a crack at the folding portion thereof, does not cause deformation after being repeatedly folded, and does not cause image distortion at the folding portion of the display. The mobile device including the foldable display using the polyester film or the laminated film as described above as the protective film of the organic EL module provides a beautiful image, is rich in functionality, and is excellent in convenience, such as portability.

DESCRIPTION OF EMBODIMENTS

Display

Figure 1:
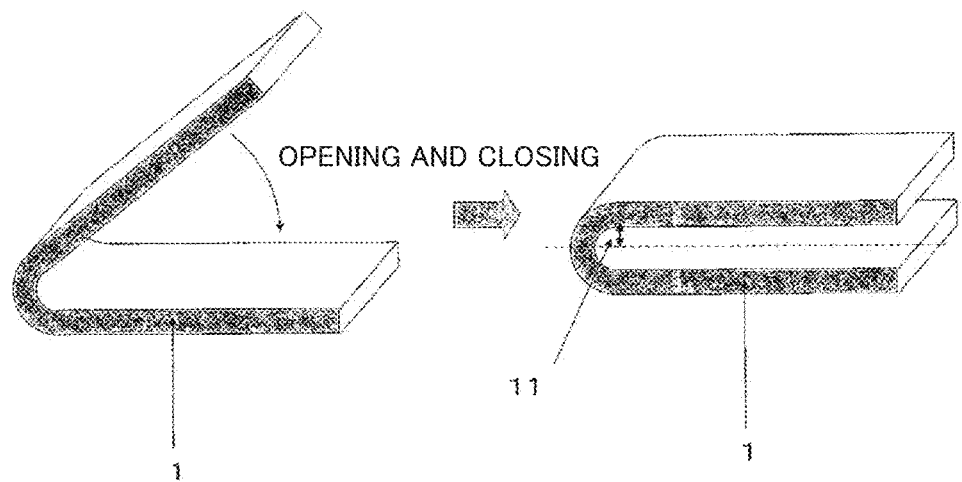
FIG. 1 is a schematic view for illustrating a bend radius at a time when a foldable display in the present invention is folded.

The term "display" as used in the present invention refers to display devices in general. There are several kinds of displays such as an LCD, an organic EL display, an inorganic EL display, an LED, and an FED. Of those, an LCD, an organic EL display, and an inorganic EL display, each of which has a foldable structure, are preferred. In particular, an organic EL display and an inorganic EL display, each of which can reduce a layer structure, are more preferred, and an organic EL display, which has a wide color gamut, is even more preferred.

Foldable Display

A foldable display is one continuous display that can be folded, for example, in half when carried. The foldable display can be reduced in size by half by being folded, to thereby improve portability. The bend radius of the foldable display is preferably 5 mm or less, more preferably 3 mm or less. When the bend radius is 5 mm or less, thinning in a folded state can be achieved. The bend radius may be said to be desirably as small as possible. However, as the bend radius becomes smaller, a fold mark becomes more liable to be formed. The bend radius is preferably 0.1 mm or more, but may be 0.5 mm or more, or may be 1 mm or more. Even when the bend radius is 1 mm, practically sufficient thinning can be achieved at the time of carrying. The bend radius of a device when folded is measured at a point marked with reference numeral 11 in the schematic view of FIG. 1, and means the inner radius of the folding portion of the device when folded. A surface protective film to be described later may be located on the outer side or the inner side of the folded foldable display.

In addition, the foldable display may be folded in thirds or fourths, or may be of a rolling type called rollable, and all of these fall within the range of the term "foldable display" as used in the present invention.

A polyester film for a foldable display or a laminated film for a foldable display of the present invention may be used in any portion of the constituent members of a foldable display. A typical configuration of the foldable display and portions thereof in which the polyester film or the laminated film of the present invention may be used are described below by taking an organic EL display as an example. The polyester film for a foldable display of the present invention is hereinafter sometimes referred to simply as "polyester film", and the laminated film for a foldable display of the present invention is hereinafter sometimes referred to simply as "laminated film of the present invention".

Foldable Organic EL Display

A foldable organic EL display essentially includes an organic EL module, and further includes, as required, a circularly polarizing plate, a touchscreen module, a surface protective film, a back-surface protective film, and the like.

Organic EL Module

A general configuration of the organic EL module is formed of an electrode/an electron transport layer/a light-emitting layer/a hole transport layer/a transparent electrode. The polyester film or the laminated film of the present invention may be used as a substrate on which the electrode is arranged, and further, the electron transport layer, the light-emitting layer, and the hole transport layer are arranged. In particular, the polyester film or the laminated film of the present invention may be preferably used as a substrate for the transparent electrode. In this case, the substrate film is required to have high barrier properties against water vapor and oxygen, and hence the laminated film of the present invention is preferably provided with a barrier layer, such as a metal oxide layer. In order to enhance the barrier properties, a plurality of barrier layers may be provided, or a plurality of polyester films each provided with a barrier layer may be used.

Organic EL Module Protective Film

It is also preferred that a protective film be also arranged on the non-viewing side of the organic EL module. The organic EL module is generally formed on a glass substrate. In the case of a flexible display, such as a foldable display, the glass substrate is peeled off, and a film is arranged as a protective layer in place of the glass substrate. The polyester film or the laminated film of the present invention may be used as the protective film of the organic EL module. A hard coating may be applied to the protective film in order to prevent scratching.

Figure 3:
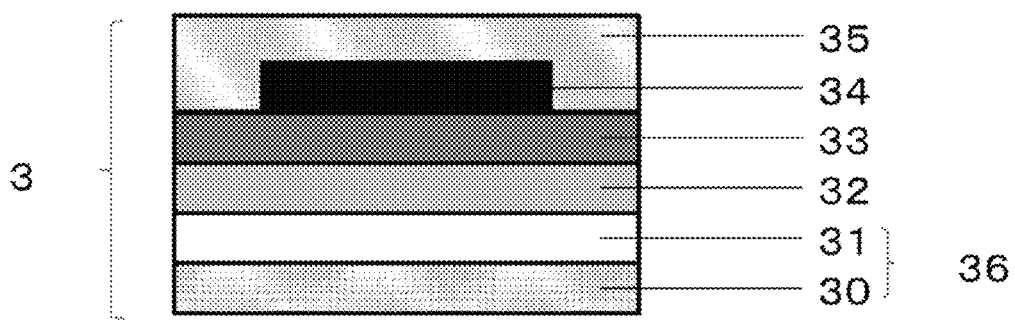
FIG. 3 is a cross-sectional schematic view of an example of an organic EL module in the present invention.

FIG. 3 is a schematic cross-sectional view of an example of an organic EL module 3 including the laminated film for protecting an organic EL module of a foldable display of the present invention. However, the present invention is not limited thereto. The organic EL module includes, on a back-surface substrate (e.g., a polyimide substrate or a polyester substrate) 32, a thin-film transistor (TFT) 33 and an organic EL element 34 in the stated order, and the organic EL element 34 is encapsulated with an encapsulating adhesive layer 35. In order to protect the back-surface substrate 32 of the organic EL panel, a polyester film 30 is bonded thereto via an adhesive layer 31. A laminated film 36 in the present invention includes the polyester film 30 and the adhesive 31, and serves as a protective film. A hard coating layer (not shown) may be laminated at least on the opposite side of the polyester film included in the laminated film 36 to the adhesive 31 (adhesive layer).

Touchscreen Module

A mobile device preferably includes a touchscreen. When the organic EL display is used, the touchscreen module is preferably arranged above the organic EL display, or between the organic EL module and the circularly polarizing plate. The touchscreen module includes a transparent substrate, such as a film, and a transparent electrode arranged thereon. The polyester film or the laminated film of the present invention may be used as the transparent substrate. When used as the transparent substrate of the touchscreen, the polyester film or the laminated film is preferably provided with a hard coating layer and a refractive index adjusting layer.

Circularly Polarizing Plate

The circularly polarizing plate suppresses a reduction in image quality caused by reflection of external light by a member inside the display. The circularly polarizing plate includes a linearly polarizing plate and a retardation plate. The linearly polarizing plate includes a polarizer and a protective film at least on the surface thereof on a viewing side. The linearly polarizing plate may also include a protective film on the surface of the polarizer opposite to the viewing side, or the retardation plate may be directly laminated on the polarizer. A resin film having a retardation made of polycarbonate, a cyclic olefin, or the like, or a product obtained by arranging a retardation layer formed of a liquid crystal compound on a resin film is used as the retardation plate. The polyester film of the present invention may be used as the polarizer protective film or the resin film for the retardation plate. In those cases, it is preferred that the slow axis direction of the polyester film in the laminated film of the present invention be parallel or orthogonal to the absorption axis direction of the polarizer. A deviation of up to 10°, preferably 5° with respect to the parallel or orthogonal direction is allowable.

Surface Protective Film

A circuit in the organic EL module or the touchscreen module may be broken when an impact is applied to the display from above, and hence a surface protective film is arranged in many cases. The laminated film of the present invention is used as the surface protective film. The surface protective film encompasses one called a "cover window" surface protective film, which is built into the outermost surface of the display, and one called an "aftermarket" surface protective film, which a user himself/herself can bond, peel off, and exchange, but in any case, the polyester film or the laminated film of the present invention may be used. When the polyester film or the laminated film of the present invention is used as the surface protective film, a hard coating layer is preferably laminated on the polyester film surface of the laminated film on the opposite side to an adhesive layer. The polyester film or the laminated film is arranged on the surface of the foldable display with the hard coating layer being on the viewing side. The hard coating layer may be arranged on both surfaces.

The polyester film or the laminated film of the present invention is preferably used as the protective film of the organic EL module of the foldable display.

In addition, the foldable display does not need to use the polyester film or the laminated film of the present invention for all of the foregoing. In the foldable display, in addition to the polyester, a polyimide film, a polyamide film, a polyamide imide film, a polyester film except the polyester film of the present invention, a polycarbonate film, an acrylic film, a triacetylcellulose film, a cycloolefin polymer film, a polyphenylene sulfide film, a polymethylpentene film, or the like may be appropriately used as a substrate of the polyester film or the laminated film of the present invention depending on its suitability.

The substrate of the laminated film of the present invention may be a monolayered film formed of one or more kinds of polyester resins. When two or more kinds of polyester resins are used, the substrate may be a multilayered film or an ultra-multilayered lamination film having a repeating structure.

The polyester film for protecting an organic EL module of a foldable display in the present invention is hereinafter sometimes referred to simply as "polyester film in the present invention" or "polyester film".

Examples of the polyester resin to be used in the polyester film include polyethylene terephthalate, polybutylene terephthalate, polyethylene-2,6-naphthalate, and a polyester film formed of a copolymer containing the component of any such resin as a main component. Of those, a stretched polyethylene terephthalate film is particularly preferred from the viewpoints of, for example, mechanical properties, heat resistance, transparency, and price.

When the polyester copolymer is used in the polyester film, examples of the dicarboxylic acid component of the polyester include: aliphatic dicarboxylic acids, such as adipic acid and sebacic acid; aromatic dicarboxylic acids, such as terephthalic acid, isophthalic acid, phthalic acid, and 2,6-naphthalene dicarboxylic acid; and multifunctional carboxylic acids, such as trimellitic acid and pyromellitic acid. In addition, examples of the glycol component of the polyester include: fatty acid glycols, such as ethylene glycol, diethylene glycol, 1,4-butanediol, propylene glycol, and neopentyl glycol; aromatic glycols, such as p-xylene glycol; alicyclic glycols, such as 1,4-cyclohexanedimethanol; and polyethylene glycols each having an average molecular weight of from 150 to 20,000. The mass ratio of the copolymer component of the copolymer is preferably less than 20 mass %. A case in which the mass ratio is less than 20 mass % is preferred because film strength, transparency, and heat resistance are retained.

In addition, in the production of the polyester film, at least one kind of resin pellet preferably has a limiting viscosity of from 0.50 dl/g to 1.0 dl/g. A case in which the limiting viscosity is 0.50 dl/g or more is preferred because the impact resistance of a film to be obtained is improved, and hence breakage of a circuit in the display due to an external impact hardly occurs. Meanwhile, a case in which the limiting viscosity is 1.00 dl/g or less is preferred because film production can be easily operated in a stable manner without an excessively large increase in filtration pressure of molten fluid.

The thickness of the polyester film is preferably from 10 µm to 300 µm, more preferably from 10 µm to 100 µm, still more preferably from 10 µm to 80 µm, particularly preferably from 25 µm to 75 µm. When the thickness is 10 µm or more, a pencil hardness improvement effect and an impact resistance improvement effect are exhibited. When the thickness is 300 µm or less, there is an advantage in terms of weight reduction, and excellent flexibility, processability, handleability, and the like are obtained.

The surface of the polyester film of the present invention may be smooth or uneven. However, decreased optical properties due to unevenness are not preferred because the film is used for the protective film of an organic EL module. A haze is preferably 3% or less, more preferably 2% or less, most preferably 1% or less. When the haze is 3% or less, the visibility of an image can be improved. The lower limit of the haze is desirably as small as possible, but is preferably 0.1% or more from the viewpoint of stable production, and may be 0.3% or more.

From the purpose of reducing the haze as described above, the unevenness of the film surface is desirably not so large. However, to provide the film with moderate slipperiness for the viewpoint of handleability, unevenness may be formed on the film surface by blending particles into the polyester resin layer serving as the surface layer, or by coating the polyester resin layer with a particle-containing coating layer during a film formation process.

A known method may be adopted as a method of blending particles into the polyester resin layer. For example, the particles, which may be added in any stage of polyester production, may be preferably added in the form of a slurry prepared by dispersing the particles in, for example, ethylene glycol in the stage of esterification, in a stage after the completion of a transesterification reaction, or in a stage before the start of a polycondensation reaction to advance the polycondensation reaction. Alternatively, the particles may be added by, for example, a method of blending a slurry prepared by dispersing the particles in, for example, ethylene glycol or water with a polyester material by using a kneading extruder with a vent, or a method of blending dry particles with a polyester material by using a kneading extruder.

In particular, preferred is a method involving: homogeneously dispersing the aggregates of inorganic particles in a monomer solution, which is part of a polyester material; then filtering the dispersion; and adding the filtrate to the remainder of the polyester material before, during, or after an esterification reaction. This method, due to the low viscosity of the monomer solution, enables homogeneous dispersion of particles and high-precision filtration of the slurry in a simple manner, while ensuring excellent particle dispersibility and low likeliness of the occurrence of new aggregates when the particles are added to the remainder of the polyester material. From such viewpoints, it is particularly preferred to add the particles to the remainder of the polyester material in a low-temperature state before the esterification reaction.

In addition, the number of protrusions on the surface of the film may be further reduced by a method involving preparing a particle-containing polyester beforehand, and then subjecting pellets of the particle-containing polyester and particle-free pellets to kneading extrusion or the like (master batch method).

In addition, the polyester film may contain various additives within the range in which a preferred range of a total light transmittance is maintained. Examples of the additives include an antistatic agent, a UV absorber, and a stabilizer.

The polyester film has a total light transmittance of preferably 85% or more, more preferably 87% or more. When the transmittance is 85% or more, visibility can be sufficiently ensured. The total light transmittance of the polyester film may be said to be desirably as high as possible, but is preferably 99% or less from the viewpoint of stable production, and may be 97% or less.

The maximum heat shrinkage ratio of the polyester film after heat treatment at 150° C. for 30 minutes is preferably 6% or less, more preferably 5% or less. When the heat shrinkage ratio is 6% or less, a flat surface failure such as curling or waviness after the bonding of the organic EL module can be suppressed. The heat shrinkage ratio may be said to be desirably as low as possible, but is preferably −1% or more, more preferably 0% or more. The minus in this case means expansion after heating, and a case in which the heat shrinkage ratio is −1% or more is preferred because the flat surface failure does not occur.

After the lamination of a hard coating layer on the polyester film or laminated film for a foldable display of the present invention, a sufficient pencil hardness can be imparted to the hard coating film. After the lamination of a hard coating layer on a related-art polyester film or laminated film, it is conceived that, in pencil hardness evaluation of the pencil hardness of the hard coating film, the pencil hardness is reduced owing to deformation of the film in its thickness direction. In the present invention, when an indentation depth after test force unloading in the film thickness direction with a dynamic ultramicrohardness meter to be described later is set to fall within a specific range, a high hardness can be achieved in the pencil hardness evaluation of the hard coating film. The indentation depth after test force unloading in the film thickness direction is preferably 1.5 μm or less, more preferably 1.4 μm or less, still more preferably 1.3 μm or less. When the indentation depth after test force unloading (final deformation amount under loading) is 1.5 μm or less, in the pencil hardness evaluation of the hard coating film after the lamination of the hard coating layer, the film is hardly deformed in its thickness direction, and hence the pencil hardness can be increased. When the pencil hardness of the hard coating film can be increased, the surface of the display hardly has a scratch or a dent, and hence the visibility of the display is improved. The indentation depth after test force unloading may be said to be desirably as low as possible, but is preferably 0.3 μm or more, more preferably 0.5 μm or more from the viewpoints of stable production and saturation of the effect.

In order to reduce the indentation depth after test force unloading, it is effective to adjust a refractive index in the thickness direction to 1.520 or less. Means for adjusting the refractive index to 1.520 or less may be exemplified by condition settings, such as adjusting stretching ratios in a bending direction and a folding direction to high ratios, setting stretching temperatures in the bending direction and the folding direction to low temperatures, and setting a heat fixation temperature to a high temperature, within ranges in which other physical properties, and refractive indices in the bending direction and the folding direction, which are described later, can be controlled to preferred ranges.

The polyester film for a foldable display of the present invention is free of occurrence of a fold mark, a crack, or a fracture at the time of folding, and besides, can adjust a neutral plane of the display. Further, the polyester film can protect the organic EL panel from an external impact. The "neutral plane" refers to a plane to which no stress is applied between the inside of folding, to which a compressive stress is applied, and the outside, to which a tensile stress is applied. In the foldable display, the neutral plane is generally designed to be in an organic EL layer. The neutral plane may be adjusted on the basis of the elastic modulus and thickness of each layer. For this reason, the elastic modulus of the polyester film in its bending direction is preferably 2.7 GPa or less, more preferably 2.6 GPa or less, still more preferably 2.5 GPa or less. It may be said that a reduction in elastic modulus in the bending direction improves bendability, but the elastic modulus in the bending direction is preferably 1.8 GPa or more for the adjustment of the neutral plane. The elastic modulus of the polyester film in its folding direction is preferably 4.5 GPa or more, more preferably 4.6 GPa or more, still more preferably 4.7 GPa or more. When the elastic modulus in the folding direction is set to be high, the flatness of the surface of the display can be maintained during the production of the display. In addition, the organic EL panel can be protected from an external impact. The elastic modulus in the folding direction is preferably as high as possible, but is preferably 8.0 GPa or less from the viewpoint of film formability.

The surface of the polyester film of the present invention may be subjected to treatment for improving adhesiveness with a resin for forming, for example, an adhesive layer or a hard coating layer.

Examples of surface treatment methods include: unevenness-forming treatment by sandblasting treatment, solvent treatment, or the like; and oxidation treatment, such as corona discharge treatment, electron beam irradiation treatment, plasma treatment, ozone/UV irradiation treatment, flame treatment, chromic acid treatment, or hot air treatment. Those methods may be used without any particular limitation.

In addition, adhesiveness may also be improved by an adhesion-improving layer, such as an easy-to-adhere layer. Resins such as an acrylic resin, a polyester resin, a polyurethane resin, and a polyether resin may be used for the easy-to-adhere layer without any particular limitation. The easy-to-adhere layer may be formed by a general coating method, preferably a so-called in-line coating formulation.

The above-mentioned polyester film may be produced, for example, through: a polymerization step of homogenously dispersing inorganic particles in a monomer solution, which is part of a polyester material, filtering the dispersion, and then adding the filtrate to the remainder of the polyester material to polymerize a polyester; and a film-forming step of melt-extruding the polyester into a sheet shape through a filter, cooling the sheet, and then stretching the cooled sheet to form a substrate film.

Next, a method of producing the polyester film is described in detail with an example in which pellets of polyethylene terephthalate (hereinafter sometimes referred to as "PET") are used as a material for a substrate film. However, the method is not limited to this example. In addition, the example is not intended to limit the number of layers such as a monolayer structure or a multilayer structure.

After a predetermined proportion of PET pellets are mixed and dried, the mixture is fed to a known extruder for melting and laminating, and extruded from a slit die into a sheet shape, followed by cooling and solidifying the sheet on a casting roll to form an unstretched film. A monolayer may be produced with a single extruder. A multilayered (i.e., including two or more layers) film may be produced by: laminating a plurality of film layers for forming an outermost layer using two or more extruders, a multilayered manifold, or a confluence block (e.g., a confluence block with a square joint); extruding a sheet of two or more layers from a mouthpiece; and cooling the sheet on a casting roll to form an unstretched film.

In this case, it is preferred to perform high-precision filtration to remove foreign matter contained in the resin at any portion of the extruder at which the molten resin is maintained at about 280° C. during melt-extrusion. A filtering medium to be used in the high-precision filtration of the molten resin is not particularly limited, but is preferably a filtering medium of a stainless-steel sintered body because of its excellent performance for removing an aggregate containing Si, Ti, Sb, Ge, or Cu as a main component and organic matter having a high melting point.

Further, the filtering medium has a filtered particle size (initial filtration efficiency: 95%) of preferably 20 μm or less, particularly preferably 15 μm or less. When the filtered particle size (initial filtration efficiency: 95%) of the filtering medium is more than 20 μm, foreign matter having a size of 20 μm or more cannot be sufficiently removed. Although high-precision filtration of a molten resin using a filtering medium having a filtered particle size (initial filtration efficiency: 95%) of 20 μm or less may reduce productivity, such filtering medium is preferred from the viewpoint of obtaining a film having fewer protrusions caused by coarse particles.

With Regard to Refractive Index in Bending Direction

Figure 2:
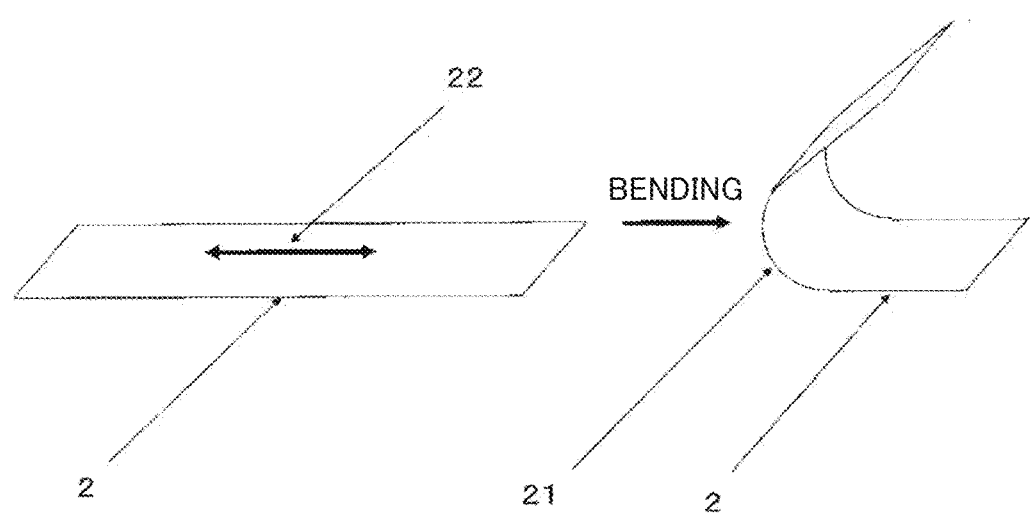
FIG. 2 is a schematic view for illustrating the bending direction of a polyester film included in a laminated film for protecting an organic EL module of a foldable display in the present invention.

In the present invention, the refractive index of the polyester film in at least any one of its longitudinal direction (machine direction) and width direction is preferably from 1.590 to 1.620, more preferably from 1.591 to 1.600. In addition, the refractive index of the polyester film in its bending direction is preferably from 1.590 to 1.620, more preferably from 1.591 to 1.600. Herein, as denoted by reference numeral 22 on a polyester film (reference numeral 2) in FIG. 2, the "bending direction" refers to a direction orthogonal to a folding portion (reference numeral 21) assumed in a foldable display application. A case in which the refractive index in at least any one of the longitudinal direction and the width direction is from 1.590 to 1.620 is preferred because deformation at the time of repeated folding is reduced to preclude a risk of reducing the image quality of the foldable display. The refractive index is more preferably from 1.591 to 1.600. Of course, the direction of the refractive index is preferably the above-mentioned bending direction. When the refractive index is 1.590 or more, there is no risk of cracking in the folding portion direction after a bending test to be described later, and as a matter of course, fracture does not occur either. Accordingly, the visibility of the display can be kept satisfactory. The refractive index of the polyester film can be effectively adjusted by adjusting the stretching ratios and the stretching temperatures. In addition, a relaxation step in a stretching direction or multi-stage stretching may be used in order to adjust the refractive index. When the multi-stage stretching is performed, it is preferred that a stretching ratio in a second or later stage be set to be higher than a stretching ratio in a first stage.

Fatigue due to a compressive stress applied to the inside of folding at the time of folding can be reduced by controlling the refractive index of the polyester film in at least any one of its longitudinal direction (machine direction) and width direction within the above-mentioned ranges, more preferably by controlling the refractive index in the bending direction within the above-mentioned ranges. The fatigue due to the compressive stress is considered to occur mainly in a crystalline portion, and a reduction in amount of crystals in the bending direction reduces the fatigue. Accordingly, it is conceived that, when the refractive index is decreased, the amount of crystals oriented in the bending direction is reduced to suppress the compression fatigue.

In addition, a creep phenomenon caused by a tensile stress applied to the outside of folding at the time of folding can be suppressed by reducing the refractive index. Fatigue due to the tensile stress is considered to occur mainly in an amorphous portion, and alignment of molecular chains due to repeatedly applied stress occurs to cause deformation. Presumably, as the number of molecular chains arranged in the bending direction becomes smaller, the deformation caused by the alignment reduces. In addition, as the amount of the amorphous portion becomes smaller, the tensile fatigue can be suppressed more, and hence a higher crystallinity, that is, a higher density is preferred.

In the present invention, the stretching ratio of an unstretched polyester sheet in at least any one of the longitudinal direction (machine direction) and the width direction is set to preferably from 1.2 times to 2.0 times, more preferably from 1.7 times to 2.0 times. In addition, the stretching direction is preferably the above-mentioned bending direction. A case in which the stretching ratio is 1.2 times or more is preferred because no deformation occurs in post-processing, such as hard coating application, and a case in which the stretching ratio is 2.0 times or less is preferred because thickness unevenness is prevented from occurring in the film. A stretching temperature is preferably from 75° C. to 120° C., more preferably from 75° C. to 105° C. Hitherto known means, such as a hot-air heating system, a roll heating system, or an infrared heating system, may be adopted as a heating method at the time of the stretching. When the stretching temperature is set to from 75° C. to 120° C., large thickness unevenness due to the stretching at the above-mentioned stretching ratio can be prevented. In addition, when the stretching is performed at as low a temperature as possible within a range in which large thickness unevenness is prevented from occurring as described above, the refractive index in the thickness direction can be reduced.

With Regard to Refractive Index in Folding Portion Direction

The refractive index in the direction orthogonal to the above-mentioned direction in which the refractive index of the polyester film is from 1.590 to 1.620 is preferably from 1.670 to 1.700. That is, the refractive index in the direction (folding portion direction) orthogonal to the bending direction is preferably from 1.670 to 1.700. When the refractive index is set to from 1.670 to 1.700, deformation at the time of folding in the bending direction can be reduced. When the refractive index is set to 1.700 or less, cracking or fracturing in the folding portion direction can be suppressed. When the refractive index is set to 1.670 or more, bendability in the bending direction can be improved, and surface hardness can be improved. The refractive index is more preferably from 1.680 to 1.695. As a method of adjusting the refractive index in the direction orthogonal to the bending direction, there are given a stretching ratio, a stretching preheating temperature, a stretching temperature, multi-stage stretching, and film relaxation. The stretching ratio is preferably from 4.0 times to 6.0 times, more preferably from 4.4 times to 6.0 times. In addition, the stretching preheating temperature in the direction orthogonal to the bending direction is preferably from 70° C. to 110° C. When multi-stage stretching is performed in the direction orthogonal to the bending direction, it is preferred that a stretching ratio in a second or later stage be set to be higher than that in a first stage. The film may be relaxed by from 1% to 10% in each of the machine direction (longitudinal direction) and the perpendicular direction (width direction).

With Regard to Refractive Index in Thickness Direction

The refractive index in the thickness direction is preferably 1.520 or less. This is because, when the refractive index is set to 1.520 or less, even if the refractive index in the bending direction is designed to be low, a reduction in hardness of a film surface can be suppressed, and hence bendability and surface hardness can both be achieved. When the refractive index is set to 1.520 or less, the indentation depth after test force unloading in the thickness direction can be reduced to improve the hardness of the film surface, in particular, the pencil hardness of the hard coating film after the lamination of the hard coating layer. The refractive index is more preferably 1.515 or less, still more preferably 1.510 or less, particularly preferably 1.505 or less, most preferably 1.500 or less. The refractive index in the thickness direction is preferably low, but is preferably 1.3 or more from the viewpoint of stable production, and may be 1.4 or more. The refractive index is particularly preferably 1.410 or more. The above-mentioned range may be said to be achievable by increasing both of the stretching ratios in the bending direction and the folding direction, but in order to control the refractive index in the thickness direction while controlling the refractive indices in the bending direction and the width direction to preferred ranges, it is preferred to set conditions while checking a balance among the conditions of the steps of a film formation process.

As a method of controlling the refractive index in the thickness direction to the above-mentioned ranges, there is given a stretching preheating temperature, the stretching temperature, or the stretching ratio in the bending direction, the stretching preheating temperature or the stretching temperature in the folding portion direction, multi-stage stretching, high-ratio stretching, or a temperature setting for heat fixation. The stretching preheating temperature in the bending direction is preferably from 70° C. to 110° C. The stretching temperature in the bending direction is preferably from 75° C. to 120° C. The stretching ratio in the bending direction is preferably from 1.2 times to 2.0 times, more preferably from 1.7 times to 2.0 times. When stretching is performed at a low stretching temperature and a low stretching ratio, the refractive index in the thickness direction can be effectively decreased while the bendability in the bending direction is maintained. The stretching preheating temperature in the folding portion direction is also preferably from 75° C. to 110° C. The stretching temperature is preferably from 75° C. to 120° C. The stretching ratio in the folding portion is preferably from 4.0 times to 6.0 times, more preferably from 4.4 times to 6.0 times. While the refractive index in the bending direction is maintained or reduced, the refractive index in the thickness direction can be effectively reduced. Multi-stage stretching may be used as a method for high-ratio stretching. In that case, a stretching ratio in a second stage is preferably set to be higher than a stretching ratio in a first stage because the refractive index can be effectively controlled. In addition, a system involving performing stretching again after a crystallization step may be used. Accelerated stretching involving increasing stretching speed from an early stage of stretching to a late stage may be used.

The heat fixation temperature is preferably from 180° C. to 240° C. When heat fixation is performed, crystallization oriented in the stretching direction can proceed to decrease the refractive index in the thickness direction.

The reason why the hardness of the film surface is improved by decreasing the refractive index in the thickness direction is not necessarily clear, but it is conceivable that aromatics, such as benzene rings, in molecular chains are oriented in a plane direction to exhibit a suppressing effect on deformation due to stress applied in the thickness direction.

With Regard to Density of Polyester Film

The density of the polyester film is preferably 1.380 g/cm$^3$ or more. The density is more preferably 1.383 g/cm$^3$ or more. When the density is set to 1.380 g/cm$^3$ or more, the bendability can be improved, and the film surface hardness, in particular, the pencil hardness of the hard coating film after the lamination of the hard coating layer can be improved. The density is preferably as high as possible, and is preferably 1.40 g/cm$^3$ or less, though somewhat depending on, for example, the presence or absence of particles in the film. When the heat fixation temperature at the time of film formation is set to from 180° C. to 240° C., crystallization can be caused to proceed to effectively increase the density.

The bending direction of the polyester film is preferably caused to correspond to its longitudinal direction (machine direction). With this configuration, the refractive index in the bending direction can be easily decreased in second-axial stretching, and hence the bendability can be easily improved. That is, a preferred polyester film is obtained by stretching the unstretched polyester sheet in its longitudinal direction at a stretching ratio of from 1.2 times to 2.0 times, more preferably from 1.7 times to 2.0 times. In addition, it may be said that a preferred mode involves performing stretching in the width direction at a stretching ratio of from 4.0 times to 6.0 times, more preferably from 4.4 times to 6.0 times.

In addition, in the present invention, it may be said that, in a particularly preferred mode, the polyester film is caused to simultaneously have the following four characteristics:

(1) the refractive index in the bending direction is from 1.590 to 1.620;
(2) the refractive index in the folding portion direction is from 1.670 to 1.700;
(3) the refractive index in the thickness direction is 1.520 or less; and
(4) the density is 1.380 g/cm$^3$ or more.

However, even in the case of a combination within the ranges of the above-mentioned preferred production conditions, when the combination is a combination of conditions that cannot be said to be the best within the respective preferred production condition ranges, such as a combination of a stretching ratio in the bending direction of 1.4 times or less, a stretching ratio in the folding portion direction of less than 4.4 times, and a heat fixation temperature of 220° C. or less, a polyester film that simultaneously satisfies the above-mentioned four characteristics may not be necessarily obtained in some cases. In this case, the above-mentioned four characteristics can be simultaneously satisfied through a fine adjustment of any one of the conditions, such as an increase in stretching ratio in the bending direction to 1.7 times or more, an increase in stretching ratio in the folding portion direction to 4.4 times or more, an increase in heat fixation temperature to about 230° C., or a decrease in stretching temperature in the bending direction and/or the folding portion direction, or a combination thereof.

In order to adjust film formability, film strength, thermal dimensional stability, appearance failure, and the like, any film formation system involving, for example, stretching, relaxation, heat fixation, and surface treatment may be adopted, but it may be said that the control of the refractive indices and density of the film to the above-mentioned preferred ranges is a particularly preferred mode in the present invention. When the refractive indices and the density are controlled to the preferred ranges, there can be provided a laminated film suitable for a foldable display, which can obtain bending resistance and surface hardness superior to those of the related-art film, in particular, a high pencil hardness of the hard coating film after the lamination of the hard coating layer.

Specifically, for example, after the pellets of PET are sufficiently dried in vacuum, the pellets are fed into an extruder, and melt-extruded in a sheet shape at about 280° C., followed by cooling and solidifying the sheet to form an unstretched PET sheet. The obtained unstretched sheet is stretched at a ratio of from 1.2 times to 2.0 times, more preferably from 1.7 times to 2.0 times in the longitudinal direction with rolls heated to from 75° C. to 120° C. to obtain a uniaxially oriented PET film. Further, the film is held with clips at the end portions thereof, guided to a hot air zone heated to from 75° C. to 120° C., dried, and then stretched at a ratio of from 4.0 times to 6.0 times, more preferably from 4.4 times to 6.0 times in the width direction. Subsequently, the film may be guided to a heat treatment zone at from 180° C. to 240° C., and treated with heat for 1 second to 60 seconds. During this heat treatment step, the film may be subjected to relaxation treatment by from 0% to 10% in the width direction or the longitudinal direction as required.

The limiting viscosity of the polyester film preferably falls within the range of from 0.50 dl/g to 1.0 dl/g. A case in which the limiting viscosity is 0.50 dl/g or more is preferred because impact resistance is improved, and hence breakage of a circuit in the display due to an external impact hardly occurs. Meanwhile, a case in which the limiting viscosity is 1.00 dl/g or less is preferred because film production is stabilized without an excessively large increase in filtration pressure of molten fluid.

Easy-to-Adhere Layer

In the present invention, in order to improve an adhesive property between the polyester film and the hard coating layer or the like, it is also preferred to laminate an easy-to-adhere layer on the polyester film. The easy-to-adhere layer may be obtained by applying an application liquid for forming the easy-to-adhere layer to one surface or both surfaces of an unstretched or longitudinally uniaxially stretched film, then drying the application liquid through heat treatment as required, and stretching the film in at least one unstretched direction. Heat treatment may also be performed after biaxial stretching. The final application amount of the easy-to-adhere layer is preferably controlled to from 0.005 g/m² to 0.20 g/m². A case in which the application amount is 0.005 g/m² or more is preferred because an adhesive property is obtained. Meanwhile, a case in which the application amount is 0.20 g/m² or less is preferred because blocking resistance is obtained.

As a resin that is incorporated into the application liquid to be used in the lamination of the easy-to-adhere layer, resins such as a polyester-based resin, a polyether polyurethane-based resin, a polyester polyurethane resin, a polycarbonate polyurethane resin, and an acrylic resin may be used without any particular limitation. Examples of a crosslinking agent that is incorporated into the application liquid for forming the easy-to-adhere layer include a melamine compound, an isocyanate compound, an oxazoline compound, an epoxy compound, and a carbodiimide compound. A mixture of two or more kinds may be used as each of the resin and the crosslinking agent. Those materials are preferably applied as an aqueous application liquid because of the properties of in-line coating, and the resin and the crosslinking agent are preferably a water-soluble or water-dispersible resin and compound.

Particles are preferably added to the easy-to-adhere layer in order to impart an easy slipping property. The average particle diameter of the fine particles is preferably 2 μm or less. When the average particle diameter of the particles is more than 2 μm, the particles are liable to fall out of the easy-to-adhere layer. Examples of the particles that are incorporated into the easy-to-adhere layer include: inorganic particles, such as titanium dioxide, barium sulfate, calcium carbonate, calcium sulfate, silica, alumina, talc, kaolin, clay, calcium phosphate, mica, hectorite, zirconia, tungsten oxide, lithium fluoride, and calcium fluoride; and organic polymer-based particles, such as styrene-based particles, acrylic particles, melamine-based particles, benzoguanamine-based particles, and silicone-based particles. Those particles may be added alone or in combination thereof to the easy-to-adhere layer.

In addition, a known method may be used as a method of applying the application liquid as in the case of the application layer described above. Examples thereof include a reverse roll coating method, a gravure coating method, a kiss coating method, a roll brush coating method, a spray coating method, an air knife coating method, a wire bar coating method, and a pipe doctor method. Those methods may be performed alone or in combination thereof.

Hard Coating Layer

When the polyester film or the laminated film of the present invention is used as the protective film for protecting the organic EL module, in the case of the laminated film, the laminated film preferably includes the hard coating layer on its polyester film surface on the opposite side to the adhesive layer. The hard coating layer is also preferably used in the display by being positioned on the display surface side of the polyester film. As a resin for forming the hard coating layer, resins such as an acrylic resin, a siloxane-based resin, an inorganic hybrid-based resin, a urethane acrylate-based resin, a polyester acrylate-based resin, and an epoxy-based resin may be used without any particular limitation. In addition, a mixture of two or more materials may be used, and particles such as an inorganic filler and an organic filler may be added.

Thickness of Hard Coating Layer

The thickness of the hard coating layer is preferably from 1 μm to 50 μm. A case in which the thickness is 1 μm or more is preferred because sufficient curing occurs to increase pencil hardness. In addition, when the thickness is set to 50 μm or less, curling caused by hardening and contraction of the hard coating can be suppressed, and thus film handleability can be increased.

Application Method

As a method of applying the hard coating layer, for example, a Meyer bar, a gravure coater, a die coater, and a knife coater may be used without any particular limitation and may be appropriately selected in accordance with viscosity and thickness.

Curing Condition

As a method of curing the hard coating layer, for example, a curing method using energy beams, such as UV light or electron beams, or a curing method using heat may be used. In order to reduce damage to the film, a curing method using UV light or electron beams is preferred.

Pencil Hardness

The pencil hardness of the hard coating layer is preferably 3H or more, more preferably 4H or more. When the pencil hardness is 3H or more, the hard coating layer is prevented from being easily scratched, and the visibility is not decreased. The pencil hardness of the hard coating layer is generally preferably as high as possible. However, the pencil hardness may be 9H or less or 8H or less, and even a hard coating layer having a pencil hardness of 6H or less is usable in practice without problems.

Characteristics of Hard Coating Layer

The hard coating layer in the present invention may be used for the purpose of protecting the display by increasing the pencil hardness of the surface as described above, and preferably has a high transmittance. The transmittance of the hard coating film is preferably 87% or more, more preferably 88% or more. When the transmittance is 87% or more, sufficient visibility is obtained. The total light transmittance of the hard coating film is generally preferably as high as possible, but is preferably 99% or less from the viewpoint of stable production, and may be 97% or less. In addition, the haze of the hard coating film is generally preferably low, and is preferably 3% or less. The haze of the hard coating film is more preferably 2% or less, most preferably 1% or less. When the haze is 3% or less, the visibility of an image can be improved. The haze is generally desirably as low as possible, but is preferably 0.1% or more from the viewpoint of stable production, and may be 0.3% or more.

The hard coating layer may further have any other function imparted thereto. For example, hard coating layers each having functionality imparted thereto, such as an antiglare layer, an antiglare antireflection layer, an antireflection layer, a low-reflection layer, and an antistatic layer each having the above-mentioned certain pencil hardness, are also preferably applied in the present invention.

Adhesive Layer

A material for forming the adhesive layer in the laminated film is not particularly limited, and for example, hitherto known adhesives, such as rubber-based, acrylic, and polyolefin-based adhesives, may be used. Examples of the rubber-based adhesive include a natural rubber, a butadiene rubber, an isoprene rubber, and a styrene-based block copolymer elastomer, such as SBS, SIS, SEBS, or SEPS. Examples of the acrylic adhesive include products obtained by crosslinking copolymers of methyl (meth)acrylate, ethyl (meth)acrylate, butyl (meth)acrylate, pentyl (meth)acrylate, hexyl (meth)acrylate, 2-ethylhexyl (meth)acrylate, and the like. Examples of the crosslinking agent include an isocyanate compound, an epoxy compound, a metal chelate agent, and a compound having a plurality of double bonds. Examples of the polyolefin-based adhesive include: an ethylene-propylene rubber, such as EPM or EPDM; a product containing the ethylene-propylene rubber as a soft segment and polyethylene or polypropylene as a hard segment; and a blend of the ethylene-propylene rubber and polyethylene or polypropylene. The adhesive property of the adhesive layer may be adjusted by adding a known tackifier, softening agent, or the like to the layer. In addition, the adhesive property may also be adjusted by adjusting the molecular weight of a base polymer to be used. The adhesive layer may further contain other components. Examples of the other components include additives (i.e., auxiliary agents), such as a dye, a pigment, an antistatic agent, an antioxidant, a light stabilizer, a UV absorber, a neutralizer, a nucleating agent, an epoxy stabilizer, a lubricant, an antimicrobial agent, a flame retardant, and a plasticizer.

Thickness of Adhesive Layer

The thickness of the adhesive layer is from 1 μm to 50 μm, preferably from 2 μm to 40 μm, more preferably from 4 μm to 30 μm.

Application Method

A method involving, for example, applying and drying a adhesive solution, or applying an acrylic monomer or oligomer, followed by radiation curing may be adopted, or a substrate-less adhesive sheet for optical use (OCA) may be transferred.

An adhesive force (peel strength) is preferably changed depending on a member to which the adhesive layer is bonded. In the foldable display, when the adhesive force is weak, a problem in that a bent portion floats occurs, and hence the adhesive force with glass after 24 hours is preferably from 10 N/25 mm to 40 N/25 mm.

A release film may be arranged on the surface (surface opposite to the polyester film) of the adhesive layer.

Release Film

A film widely used as a release film may be appropriately used as the release film for the adhesive sheet. A resin for a substrate film is not particularly limited, and any resin capable of forming a resin film, such as polyester, polycarbonate, polyamide, polyimide, polyamide imide, polystyrene, triacetylcellulose, polypropylene, or cyclic polyolefin, may be used without any limitation. Of those, polyester is preferred from the viewpoints of mechanical strength, heat resistance, supply stability, and the like, and polyethylene terephthalate is more preferred. In addition, the film may be an unstretched film or a stretched film. In the case of being a stretched film, the film may be an uniaxially stretched film or a biaxially stretched film. Of those, a biaxially stretched polyethylene terephthalate film is preferred.

When the substrate film itself has releasability, the substrate film may be used as it is as the release film. In addition, surface treatment, such as corona treatment, plasma treatment, or flame treatment, may be performed in order to adjust releasability.

Release Layer

Further, a release layer may be arranged on the substrate film. Examples of the release layer include silicone-based, amino resin-based, alkyd resin-based, and long-chain acrylic resin-based layers, and the composition and kind thereof may be appropriately selected in accordance with a required peel force.

When the release layer is arranged, an easy-to-adhere layer may be arranged on the substrate film. As the easy-to-adhere layer, one hitherto used for any of various substrate films, such as a polyester-based, acrylic, or polyurethane-based layer, may be used, and may be selected in accordance with the substrate film and the release layer to be used.

Antistatic Layer

A release film antistatic layer may be arranged. As the release layer antistatic agents, there are given quaternary ammonium salts, conductive polymers, such as polyaniline and polythiophene, needle-shaped metal fillers, conductive fine particles having high refractive indices, such as tin-doped indium oxide fine particles and antimony-doped tin oxide fine particles, and combinations thereof.

Polyester, polyurethane, polyamide, acryl, or the like is used as a binder resin. The antistatic layer may be arranged on the release surface to be present as an underlayer of the release layer, or may be arranged on the opposite side to the release surface.

EXAMPLES

Next, the present invention is described by way of Examples and Comparative Examples. First, methods of evaluating characteristic values performed in the present invention are shown below.

(1) Limiting Viscosity

A film or a polyester resin was pulverized and dried, and then dissolved in a mixed solvent of phenol/tetrachloroethane=60/40 (mass ratio). After this solution was centrifuged to remove inorganic particles, the flow time of the solution having a concentration of 0.4 (g/dl) at 30° C. and the flow time of the solvent alone were measured with an Ubbelohde viscometer. From a time ratio therebetween, the limiting viscosity was calculated using the Huggins equation on the assumption that the constant of the Huggins equation was 0.38.

(2) Bending Resistance of Polyester Film Sample (Bend Radius: 1.5 mm)

A polyester film sample having a size of 20 mm in its width direction and 110 mm in its machine direction was prepared. The sample was bent 200,000 times at a rate of once per second using a tension-free U-shape folding test jig (DLDNLH-FS, produced by Yuasa System Co., Ltd.) with the bend radius being set to 1.5 mm. In that case, the sample was fixed at a position of 10 mm from both end portions of the long side, and the portion to be bent was 20 mm×90 mm. Here, FIG. 1 is a schematic view for illustrating a bend radius at a time when a foldable display is folded, and in consideration of a case in which a polyester film is arranged on the inside surface of the folded mode, the bending test is performed as a model assuming that the portion denoted by reference numeral 11 in FIG. 1 is set to 1.5 mm. After the completion of the bending treatment, the sample was placed on a flat surface with its bending inside facing down, and was visually observed.

◯: No crack and deformation can be recognized on the sample.

x: The sample has a crack or a fold mark, and has a maximum floating height of 5 mm or more when horizontally placed.

(3) Bending Resistance of Polyester Film Sample (Bend Radius: 0.5 mm)

A polyester film sample was bent 200,000 times at a rate of once per second by the same method as in the above-mentioned bending test with the bend radius being set to 0.5 mm. Here, FIG. 1 is a schematic view for illustrating a bend radius at a time when a foldable display is folded, and in consideration of a case in which a polyester film is arranged on the inside surface of the folded mode, the bending test is performed as a model assuming that the portion denoted by reference numeral 11 in FIG. 1 is set to 0.5 mm. The film surface on the outside of the bent portion was observed with a digital microscope (RH8800 manufactured by Hirox Co., Ltd.) at a magnification of 700, and the presence or absence of a wrinkle (crack) was observed. Separate from the above-mentioned bending resistance visual observation test at a bend radius of 1.5 mm, this test, in which the bend radius was reduced to 0.5 mm, was performed with the intention of performing evaluation under a state closer to the state of actual use of a foldable display having a hard coating layer and other members laminated or bonded thereto. Separate from the above-mentioned visual observation at a bend radius of 1.5 mm, this test is intended to detect a defect of being liable to be fractured or being liable to be cracked, which is a minute defect difficult to detect by visual observation.

◯: No defect is found on the film surface on the outside of the bending.

x: Fracture occurred, or a wrinkle (crack) can be recognized on the film surface on the outside of the bending.

(4) Bending Resistance of Laminated Film (Bend Radius: 2.0 mm)

A laminated film was bent 200,000 times at a rate of once per second by the same method as in the above-mentioned bending test with its adhesive layer being on the inside of the bending and the bend radius being set to 2.0 mm. Here, FIG. 1 is a schematic view for illustrating a bend radius at a time when a foldable display is folded, and in consideration of a case in which a polyester film is arranged on the inside surface of the folded mode, the bending test is performed as a model assuming that the portion denoted by reference numeral 11 in FIG. 1 is set to 2.0 mm. After the completion of the bending treatment, the sample was placed on a flat surface with its bending inside facing down, and was visually observed.

◯: No crack and deformation can be recognized on the sample.

x: The sample has a crack or a fold mark, and has a maximum floating height of 5 mm or more when horizontally placed.

(5) Bending Resistance of Laminated Film (Bend Radius: 1.0 mm)

A laminated film was bent 200,000 times at a rate of once per second by the same method as in the above-mentioned bending test with its adhesive layer being on the inside of the bending and the bend radius being set to 1.0 mm. Here, FIG. 1 is a schematic view for illustrating a bend radius and a bending direction at a time when a foldable display is folded, and in consideration of a case in which a polyester film is arranged on the inside surface of the folded mode, the bending test is performed as a model assuming that the portion denoted by reference numeral 11 in FIG. 1 is set to 1.0 mm. The film surface on the outside of the bent portion was observed with a digital microscope (RH8800 manufactured by Hirox Co., Ltd.) at a magnification of 700, and the presence or absence of a wrinkle (crack) was observed. Separate from the above-mentioned bending resistance visual observation test at a bend radius of 1.5 mm, this test, in which the bend radius was reduced to 1.0 mm, was performed with the intention of performing evaluation under a state closer to the state of actual use of a foldable display having a hard coating layer and other members laminated or bonded thereto. Separate from the above-mentioned visual observation at a bend radius of 1.5 mm, this test is intended to detect a defect of being liable to be fractured or being liable to be cracked, which is a minute defect difficult to detect by visual observation.

◯: No defect is found on the film surface on the outside of the bending.

x: Fracture occurred, or a wrinkle (crack) can be recognized on the film surface on the outside of the bending.

(6) Refractive Index

A refractive index in a longitudinal direction, a refractive index in a width direction, and a refractive index in a thickness direction were determined using an Abbe refractometer (NAR-4T manufactured by Atago Co., Ltd., measurement wavelength: 589 nm) in conformity with JIS K 7142:2008 "Determination of the refractive index of plastics (Method A)."

(7) Pencil Hardness

The pencil hardness of a hard coating film was measured as a sample at a rate of 1.0 mm/s under a load of 750 g in conformity with JIS K 5600-5-4:1999. In the present invention, 3H or more was regarded as acceptable.

(8) Total Light Transmittance and Haze

Measurement was performed using a haze meter (NDH 5000 manufactured by Nippon Denshoku Industries Co., Ltd.)

(9) Density

A density was measured in accordance with a method in conformity with JIS K 7112:1999 (density gradient tube method). (Unit: g/cm$^3$).

(10) Indentation Depth After Test Force Unloading

A sample was cut into a square about 2 cm on a side, and its surface opposite to a measurement surface was fixed onto a micro cover glass measuring 18 mm×18 mm (manufactured by Matsunami Glass Ind., Ltd.) with an adhesive (Cemedine (trademark) High-super 30). After the fixation by bonding, the whole was left to stand at room temperature for 12 hours or more, and then an indentation depth (μm) after test force unloading was measured using a dynamic ultra-microhardness meter "DUH-211" (manufactured by Shimadzu Corporation) under the following conditions.

<<Measurement Conditions>>

Test mode: loading-unloading test
Indenter used: triangular pyramid indenter having an angle between ridges of 115°
Elastic modulus of indenter: 1.140×10$^6$ N/mm$^2$
Poisson's ratio of indenter: 0.07
Test force: 50 mN
Loading speed: 4.44 mN/sec
Loading retention time: 2 sec
Unloading retention time: 0 sec

(11) Maximum Heat Shrinkage Ratio

A sample film was cut to measure 10 mm long by 250 mm wide. The long sides were aligned to a direction in which measurement was to be performed, the sample film was marked at an interval of 200 mm, and an interval A between the marks was measured under a constant tension of 5 g. Subsequently, the sample film was left to stand under no load in an oven having an atmosphere of 150° C. for 30 minutes, and was then removed from the oven and cooled to room temperature. After that, an interval B between the marks was determined under a constant tension of 5 g, and a heat shrinkage ratio (1) was determined by the following equation. For the heat shrinkage ratio, measurement is performed at positions equally dividing the sample film in its width direction into three parts, and the average value of three points is adopted as the heat shrinkage ratio (%).

Heat shrinkage ratio (%)=[(A−B)×100]/A

The sample film is separately cut so as to be different in length and width for each of both its bending direction and folding direction and subjected to measurement, and data in the direction in which the measured value is larger is adopted as a maximum heat shrinkage ratio (%).

(12) Elastic Moduli (Young's Moduli (Unit: GPa))

The elastic moduli of a polyester film in its bending direction and folding direction were measured at 23° C. in conformity with JIS K7127.

Preparation of Polyethylene Terephthalate Pellets (a)

A continuous esterification reactor including a three-stage complete mixing vessel including a stirrer, a condenser, a raw material feeder, and a product extracting port was used as an esterification reactor. A slurry of TPA (2 tons/hr), EG (2 mol per mol of TPA), and antimony trioxide (160 ppm of Sb atoms based on produced PET) was continuously supplied to the first esterification reaction unit of the esterification reactor, and was allowed to react at 255° C. for an average residence time of 4 hours under normal pressure. Subsequently, the reaction product in the first esterification reaction unit was taken out of the system, and supplied to the second esterification reaction unit. EG evaporated from the first esterification reaction unit (8 mass % of the produced polymer (produced PET)) was supplied to the second esterification reaction unit. Further, an EG solution containing magnesium acetate such that the amount of Mg atoms was 65 ppm based on the produced PET and an EG solution containing TMPA such that the amount of P atoms was 20 ppm based on the produced PET were added thereto, and the mixture was reacted at 260° C. for an average residence time of 1.5 hours under normal pressure. Subsequently, the reaction product in the second esterification reaction unit was continuously taken out of the system and supplied to the third esterification reaction unit. An EG solution containing TMPA such that the amount of P atoms was 20 ppm based on the produced PET was further added thereto, followed by a reaction at 260° C. for an average residence time of 0.5 hour under normal pressure. The esterification reaction product generated in the third esterification reaction unit was continuously supplied to a three-stage continuous polycondensation reactor to perform polycondensation, followed by filtration through a filtering medium of a stainless-steel sintered body (nominal filtration accuracy: 5-μm particle 90% cut). Thus, polyethylene terephthalate pellets (a) having a limiting viscosity of 0.62 dl/g were obtained.

Preparation of Polyethylene Terephthalate Pellets (b)

Polyethylene terephthalate pellets (b) were obtained by adjusting the limiting viscosity to 0.580 dl/g by the same method as in the production process of the polyethylene terephthalate pellets (a) except that the residence time for the third esterification reaction was adjusted.

Preparation of Polyethylene Terephthalate Pellets (c)

The polyethylene terephthalate pellets (a) were subjected to solid-phase polymerization at 220° C. under a reduced pressure of 0.5 mmHg with a rotary vacuum polymerization apparatus while changing the reaction time. Thus, polyethylene terephthalate pellets (c) having a limiting viscosity of 0.75 dl/g were prepared.

Polymerization of Urethane Resin

A four-necked flask with a stirrer, a Dimroth condenser, a nitrogen inlet tube, a silica gel drying tube, and a temperature gauge was loaded with 72.96 parts by mass of 1,3-bis(isocyanatomethyl)cyclohexane, 12.60 parts by mass of dimethylol propionic acid, 11.74 parts by mass of neopentyl glycol, 112.70 parts by mass of a polycarbonate diol having a number-average molecular weight of 2,000, and 85.00 parts by mass of acetonitrile and 5.00 parts by mass of N-methylpyrrolidone serving as solvents. Under a nitrogen atmosphere, the mixture was stirred at 75° C. for 3 hours, and it was recognized that the reaction liquid had reached a predetermined amine equivalent. Next, the temperature of the reaction liquid was decreased to 40° C., and then 9.03 parts by mass of triethylamine was added to provide a polyurethane prepolymer D solution. Next, 450 g of water was added to a reaction vessel with a homodisper capable of high-speed stirring. The temperature was adjusted to 25° C., and water dispersion was performed by adding the isocyanate group-terminated prepolymer while the contents were mixed by stirring at 2,000 min-1. After that, some of the acetonitrile and the water were removed under reduced pressure to prepare a water-soluble polyurethane resin (A) having a solid content of 35 mass %.

Polymerization of Water-Soluble Carbodiimide Compound

A flask with a temperature gauge, a nitrogen gas inlet tube, a reflux condenser, a dropping funnel, and a stirrer was loaded with 200 parts by mass of isophorone diisocyanate and 4 parts by mass of 3-methyl-1-phenyl-2-phosphorene-1-oxide serving as a carbodiimidation catalyst, and the mixture was stirred under a nitrogen atmosphere at 180° C. for 10 hours to provide an isocyanate-terminated isophorone carbodiimide (degree of polymerization=5). Then, 111.2 g of the resultant carbodiimide and 80 g of polyethylene glycol monomethyl ether (molecular weight: 400) were subjected to a reaction at 100° C. for 24 hours. Water was gradually added thereto at 50° C. to provide a yellow transparent water-soluble carbodiimide compound (B) having a solid content of 40 mass %.

Preparation of Application Liquid for forming Easy-to-Adhere Layer

The following coating agents were mixed to prepare an application liquid.

| | |
|---|---|
| Water | 16.97 parts by mass |
| Isopropanol | 21.96 parts by mass |
| Polyurethane resin (A) | 3.27 parts by mass |
| Water-soluble carbodiimide compound (B) | 1.22 parts by mass |
| Particles (silica sol having an average particle diameter of 40 nm, solid content concentration: 40 mass %) | 0.51 part by mass |
| Surfactant (silicone-based, solid content concentration: 100 mass %) | 0.05 part by mass |

Preparation of Hard Coating Application Liquid "a"

To 100 parts by mass of a hard coating material (OPSTAR (trademark) 27503 manufactured by JSR Corporation, concentration: 75%), 0.1 part by mass of a leveling agent (BYK307 manufactured by BYK-Chemie Japan, concentration: 100%) was added, and the mixture was diluted with methyl ethyl ketone to prepare a hard coating application liquid "a" having a solid content concentration of 40 mass %.

Preparation of Hard Coating Application Liquid "b"

95 Parts by mass of pentaerythritol triacrylate (A-TMM-3 manufactured by Shin-Nakamura Chemical Co., Ltd., solid content concentration: 100%), 5 parts by mass of a photopolymerization initiator (Irgacure (trademark) 907 manufactured by BASF Japan, solid content concentration: 100%), and 0.1 part by mass of a leveling agent (BYK307 manufactured by BYK-Chemie Japan, solid content concentration: 100%) were mixed, and the mixture was diluted with a solvent of toluene/MEK=1/1 to prepare a hard coating application liquid "b" having a concentration of 40%.

Example 1

The polyethylene terephthalate pellets (a) were fed to an extruder and melted at 285° C. The polymer was filtered through a filtering medium of a stainless-steel sintered body (nominal filtration accuracy: 10 μm-particle 95% cut) and extruded into a sheet shape from a mouthpiece, and then cooled and solidified through contact with a casting drum having a surface temperature of 30° C. using a static electricity applying casting method, to thereby produce an unstretched film. The unstretched film was uniformly heated to 75° C. using a heating roll, heated to 85° C. with a non-contact heater, and subjected to roll stretching (longitudinal stretching) at a ratio of 1.4 times. The above-mentioned application liquid for forming an easy-to-adhere layer was applied to both surfaces of the resultant uniaxially stretched film by a roll coating method, and was then dried at 80° C. for 20 seconds. An application amount after final (after biaxial stretching) drying was adjusted to 0.06 g/m. After that, the film was introduced into a tenter and preheated at 105° C., and then laterally stretched at 95° C. at a ratio of 4.0 times. The film was subjected to heat fixation at 230° C. for 5 seconds with its width fixed, and was relaxed by 4% in its width direction at 180° C. to provide a polyethylene terephthalate film having a thickness of 50 μm. After that, a double-sided adhesive sheet (manufactured by LINTEC Corporation, product name: "OPTERIA MO-3006C", thickness: 25 μm) was bonded onto one surface of the polyethylene terephthalate film to provide a laminated film. Evaluation results are shown in Tables 1 and 2.

Examples 2 and 3

Laminated films were obtained in the same manner as in Example 1 except that the stretching ratio in the longitudinal direction was changed as shown in Table 1.

Example 4

A laminated film was obtained in the same manner as in Example 1 except that the stretching ratio in the width direction was changed to 4.4 times, and the heat fixation temperature was changed to 220° C.

Examples 5 and 6

Laminated films were obtained in the same manner as in Example 4 except that the stretching ratio in the longitudinal direction was changed as shown in Table 1.

Example 7

A laminated film was obtained in the same manner as in Example 1 except that the stretching ratio in the width direction was changed to 5.5 times, and the heat fixation temperature was changed to 190° C.

Examples 8 and 9

Laminated films were obtained in the same manner as in Example 7 except that the stretching ratio in the longitudinal direction was changed as shown in Table 1.

Example 10

A laminated film was obtained in the same manner as in Example 5 except that, in the production process of Example 5, 10% relaxation heat treatment was performed at 100° C. after the stretching in the longitudinal direction.

Example 11

A laminated film was obtained in the same manner as in Example 5 except that, in the production process of Example 5, clips were released at 200° C. after the heat fixation, and relaxation heat treatment was performed in the longitudinal direction and the width direction. A tenter speed and a take-up roll speed were adjusted so as to achieve a relaxation ratio of 3% in the longitudinal direction. The relaxation in the width direction was performed so as to achieve a free state.

Example 12

A laminated film was obtained in the same manner as in Example 1 except that the temperature at the time of the stretching in the longitudinal direction was changed to 75° C., and the heat fixation temperature was changed to 220° C.

Example 13

A laminated film was obtained in the same manner as in Example 1 except that the stretching in the longitudinal direction was performed with the temperature at the time of the stretching being changed to 75° C. and the stretching ratio being changed to 1.2 times, and then the stretching in the width direction was performed with the stretching ratio being changed to 5.0 times.

Example 14

A laminated film was obtained in the same manner as in Example 3 except that the stretching in the longitudinal direction of Example 3 was changed to two-stage stretching in which a stretching ratio in the first stage was set to 1.2 times and a stretching ratio in the second stage was set to 1.67 times. The total stretching ratio in the longitudinal direction is about 2.0 times.

Example 15

A laminated film was obtained in the same manner as in Example 5 except that the preheating temperature at the time of the stretching in the width direction was changed to 95° C., and the heat fixation temperature was changed to 190° C.

Example 16

A laminated film was obtained in the same manner as in Example 2 except that the stretching in the width direction of Example 2 was changed to two-stage stretching in which a stretching ratio in the first stage was set to 1.5 times and a stretching ratio in the second stage was set to 4.0 times, and the heat fixation temperature was changed to 190° C. The total stretching ratio in the width direction is 6.0 times.

Examples 17 and 18

Laminated films were obtained in the same manner as in Example 2 except that the thickness was changed as shown in Table 2.

Example 19

A laminated film was obtained in the same manner as in Example 1 except that, in the production process of Example 1, the relaxation heat treatment in the width direction was not performed.

Example 20

An unstretched film was produced in the same manner as in Example 1. After that, in a tenter, the unstretched film was preheated at 75° C. and laterally stretched at 85° C. at a ratio of 1.4 times. The above-mentioned application liquid for forming an easy-to-adhere layer was applied to both surfaces of the resultant uniaxially stretched film by a roll coating method, and was then dried at 80° C. for 20 seconds. An application amount after final (after biaxial stretching) drying was adjusted to 0.06 g/m$^2$. The film was uniformly heated to 105° C. using a heating roll, heated to 95° C. with a non-contact heater, and subjected to roll stretching (longitudinal stretching) at a ratio of 4.0 times. The film was subjected to heat fixation at 230° C. for 5 seconds with its width fixed to provide a polyethylene terephthalate film having a thickness of 50 μm. After that, a double-sided adhesive sheet (manufactured by LINTEC Corporation, product name: "OPTERIA MO-3006C", thickness: 25 μm) was bonded onto one surface of the polyethylene terephthalate film to provide a laminated film.

Comparative Example 1

A laminated film was obtained in the same manner as in Example 1 except that lateral uniaxial stretching was performed by performing stretching only in the width direction without performing the stretching in the longitudinal direction.

Comparative Example 2

A laminated film was obtained in the same manner as in Example 7 except that lateral uniaxial stretching was performed by performing stretching only in the width direction without performing the stretching in the longitudinal direction.

Comparative Examples 3 to 7

Laminated films were obtained in the same manner as in Example 1 except that the heat fixation temperature was changed to 220° C., and PET pellets and thicknesses shown in Tables 1 and 2 were adopted.

In Comparative Examples 3 to 7, as described above, the heat fixation temperature is lower than in Example 1, and the stretching ratios in the longitudinal direction and the width direction are a combination of respective condition levels that cannot be said to be the best within preferred condition ranges. Consequently, as shown in Table 2, the refractive index in the thickness direction increased, the indentation depth after test force unloading increased, and the pencil hardness after the lamination of a hard coating layer reduced as compared to Examples.

Comparative Example 8

A laminated film was obtained in the same manner as in Example 1 except that the stretching ratio in the longitudinal direction was changed to 2.7 times, and the heat fixation temperature was changed to 220° C.

Comparative Example 9

A laminated film was obtained in the same manner as in Example 1 except that the stretching ratio in the longitudinal direction was changed to 3.4 times.

Comparative Example 10

A laminated film was obtained in the same manner as in Example 4 except that the heat fixation temperature was changed to 100° C.

Comparative Example 11

A laminated film was obtained in the same manner as in Example 13 except that the stretching temperature in the longitudinal direction was changed to 130° C.

Comparative Example 12

A laminated film was obtained in the same manner as Example 1 except that the preheating temperature in the width direction was changed to 120° C.

To the polyester film surface of each of the produced laminated films described above on the opposite side to the adhesive layer, a Meyer bar was used to apply the hard coating application liquid "a" so as to have a film thickness of 5 μm after drying. Drying was performed at 80° C. for 1 minute, followed by irradiation with UV light (cumulative light quantity: 200 mJ/cm$^2$) to provide a hard coating film.

Example 21

In addition, a laminated film was obtained in the same manner as in Example 1, and then a hard coating film was obtained by applying the hard coating application liquid "b" in place of the hard coating application liquid "a" in the same manner as above.

The adhesive layer side of the hard coating film was bonded to an organic EL module to prepare a smartphone-type foldable display that is foldable in half in the middle, with a radius of 3 mm, which corresponds to the bend radius in FIG. 1. The hard coating film was arranged on the surface of a single piece of display continuous across the folding portion, and was arranged so that the hard coating layer was positioned on the surface of the organic EL module. The displays prepared by using the hard coating films (laminated films) of Examples were satisfactory in operation and visibility as a smartphone that can be folded in half in the middle, and carried. In addition, the surfaces of the displays were not recessed by an external force. Meanwhile, the foldable displays prepared by using the hard coating films of Comparative Examples were not particularly preferred because the displays appeared to begin having image distortion in the folding portion as the displays were used frequently. In addition, some of the displays had a dent or a scratch on their surfaces.

TABLE 1

| | PET pellets | | | PET film | | | | | | |
|---|---|---|---|---|---|---|---|---|---|---|
| | | Limiting | Limiting | Stretching ratio | | Stretching temperature in longitudinal | Preheating temperature in width | Heat fixation | | Relaxation |
| | Kind | viscosity (dl/g) | viscosity (dl/g) | Longitudinal direction | Width direction | direction (° C.) | direction (° C.) | temperature (° C.) | Relaxation direction | ratio (%) |
| Example 1 | (a) | 0.62 | 0.58 | 1.4 | 4.0 | 85 | 105 | 230 | Width direction | 4 |
| Example 2 | (a) | 0.62 | 0.58 | 1.7 | 4.0 | 85 | 105 | 230 | Width direction | 4 |
| Example 3 | (a) | 0.62 | 0.58 | 2.0 | 4.0 | 85 | 105 | 230 | Width direction | 4 |
| Example 4 | (a) | 0.62 | 0.58 | 1.4 | 4.4 | 85 | 105 | 220 | Width direction | 4 |
| Example 5 | (a) | 0.62 | 0.58 | 1.7 | 4.4 | 85 | 105 | 220 | Width direction | 4 |
| Example 6 | (a) | 0.62 | 0.58 | 2.0 | 4.4 | 85 | 105 | 220 | Width direction | 4 |
| Example 7 | (a) | 0.62 | 0.58 | 1.4 | 5.5 | 85 | 105 | 190 | Width direction | 4 |
| Example 8 | (a) | 0.62 | 0.58 | 1.7 | 5.5 | 85 | 105 | 190 | Width direction | 4 |
| Example 9 | (a) | 0.62 | 0.58 | 2.0 | 5.5 | 85 | 105 | 190 | Width direction | 4 |
| Example 10 | (a) | 0.62 | 0.58 | 1.7 | 4.4 | 85 | 105 | 220 | Longitudinal direction | 10 |
| Example 11 | (a) | 0.62 | 0.58 | 1.7 | 4.4 | 85 | 105 | 220 | Longitudinal/Width direction | 3/— |
| Example 12 | (a) | 0.62 | 0.58 | 1.4 | 4.0 | 75 | 105 | 220 | Width direction | 4 |
| Example 13 | (a) | 0.62 | 0.58 | 1.2 | 5.0 | 75 | 105 | 220 | Width direction | 4 |
| Example 14 | (a) | 0.62 | 0.58 | 2.0 (two stages) | 4.0 | 85 | 105 | 230 | Width direction | 4 |
| Example 15 | (a) | 0.62 | 0.58 | 1.7 | 4.4 | 85 | 95 | 190 | Width direction | 4 |
| Example 16 | (a) | 0.62 | 0.58 | 1.7 | 6.0 (two stages) | 85 | 105 | 190 | Width direction | 4 |
| Example 17 | (a) | 0.62 | 0.58 | 1.7 | 4.0 | 85 | 105 | 230 | Width direction | 4 |
| Example 18 | (a) | 0.62 | 0.58 | 1.7 | 4.0 | 85 | 105 | 230 | Width direction | 4 |
| Example 19 | (a) | 0.62 | 0.58 | 1.4 | 4.0 | 85 | 105 | 230 | — | 0 |
| Example 20 | (a) | 0.62 | 0.58 | 4.0 | 1.4 | 105 | 85 | 230 | — | 0 |
| Example 21 | (a) | 0.62 | 0.58 | 1.4 | 4.0 | 85 | 105 | 230 | Width direction | 4 |
| Comparative Example 1 | (a) | 0.62 | 0.58 | 1.0 | 4.0 | — | 105 | 220 | Width direction | 4 |

TABLE 1-continued

| | PET pellets | | | | PET film | | | | |
| | | Limiting viscosity (dl/g) | Limiting viscosity (dl/g) | Stretching ratio | | Stretching temperature in longitudinal direction (° C.) | Preheating temperature in width direction (° C.) | Heat fixation temperature (° C.) | Relaxation direction | Relaxation ratio (%) |
| | Kind | | | Longitudinal direction | Width direction | | | | | |
|---|---|---|---|---|---|---|---|---|---|---|
| Comparative Example 2 | (a) | 0.62 | 0.58 | 1.0 | 5.5 | — | 105 | 190 | Width direction | 4 |
| Comparative Example 3 | (a) | 0.62 | 0.58 | 1.4 | 4.0 | 85 | 105 | 220 | Width direction | 4 |
| Comparative Example 4 | (a) | 0.62 | 0.58 | 1.4 | 4.0 | 85 | 105 | 220 | Width direction | 4 |
| Comparative Example 5 | (a) | 0.62 | 0.58 | 1.4 | 4.0 | 85 | 105 | 220 | Width direction | 4 |
| Comparative Example 6 | (b) | 0.58 | 0.54 | 1.4 | 4.0 | 85 | 105 | 220 | Width direction | 4 |
| Comparative Example 7 | (c) | 0.75 | 0.69 | 1.4 | 4.0 | 85 | 105 | 220 | Width direction | 4 |
| Comparative Example 8 | (a) | 0.62 | 0.58 | 2.7 | 4.0 | 85 | 105 | 220 | Width direction | 4 |
| Comparative Example 9 | (a) | 0.62 | 0.58 | 3.4 | 4.0 | 85 | 105 | 230 | Width direction | 4 |
| Comparative Example 10 | (a) | 0.62 | 0.58 | 1.4 | 4.4 | 85 | 105 | 100 | Width direction | 4 |
| Comparative Example 11 | (a) | 0.62 | 0.58 | 1.2 | 5.0 | 130 | 105 | 220 | Width direction | 4 |
| Comparative Example 12 | (a) | 0.62 | 0.58 | 1.4 | 4.0 | 85 | 120 | 230 | Width direction | 4 |

TABLE 2

| | Thickness (μm) | Density (g/cm³) | Refractive index Longitudinal direction | Refractive index Width direction | Refractive index Thickness direction | Bending direction | PET film Elastic modulus (GPa) Longitudinal direction | PET film Elastic modulus (GPa) Width direction | Continous bending test at bend radius of 1.5 mm | Continous bending test at bend radius of 0.5 mm | Indentation depth after unloading (μm) | Total light transmittance (%) | Haze (%) | Maximum heat shrinkage ratio (%) | Laminated film with adhesive layer Adhesive layer Thickness (μm) | Continous bending test at bend radius of 2.0 mm | Continous bending test at bend radius of 1.0 mm | Hard coating application liquid | Hard coating film Pencil hardness |
|---|---|---|---|---|---|---|---|---|---|---|---|---|---|---|---|---|---|---|---|
| Example 1 | 50 | 1.385 | 1.596 | 1.684 | 1.516 | Longitudinal direction | 2.3 | 5.4 | ○ | ○ | 1.48 | 91 | 0.8 | 1.4 | 25 | ○ | ○ | a | 3H |
| Example 2 | 50 | 1.385 | 1.602 | 1.681 | 1.512 | Longitudinal direction | 2.4 | 4.8 | ○ | ○ | 1.47 | 91 | 0.8 | 1.5 | 25 | ○ | ○ | a | 3H |
| Example 3 | 50 | 1.387 | 1.609 | 1.679 | 1.509 | Longitudinal direction | 2.3 | 4.7 | ○ | ○ | 1.42 | 91 | 0.8 | 1.6 | 25 | ○ | ○ | a | 3H |
| Example 4 | 50 | 1.383 | 1.592 | 1.69 | 1.517 | Longitudinal direction | 2.2 | 5.7 | ○ | ○ | 1.48 | 91 | 0.8 | 1.7 | 25 | ○ | ○ | a | 3H |
| Example 5 | 50 | 1.383 | 1.597 | 1.688 | 1.515 | Longitudinal direction | 2.3 | 5.1 | ○ | ○ | 1.45 | 91 | 0.8 | 1.9 | 25 | ○ | ○ | a | 3H |
| Example 6 | 50 | 1.384 | 1.598 | 1.686 | 1.513 | Longitudinal direction | 2.4 | 5.0 | ○ | ○ | 1.4 | 91 | 0.8 | 2.2 | 25 | ○ | ○ | a | 3H |
| Example 7 | 50 | 1.383 | 1.591 | 1.694 | 1.513 | Longitudinal direction | 2.2 | 6.3 | ○ | ○ | 1.35 | 91 | 0.8 | 4.4 | 25 | ○ | ○ | a | 3H |
| Example 8 | 50 | 1.383 | 1.596 | 1.690 | 1.512 | Longitudinal direction | 2.3 | 5.9 | ○ | ○ | 1.38 | 91 | 0.8 | 4.9 | 25 | ○ | ○ | a | 3H |
| Example 9 | 50 | 1.383 | 1.597 | 1.688 | 1.513 | Longitudinal direction | 2.4 | 5.8 | ○ | ○ | 1.41 | 91 | 0.8 | 5.1 | 25 | ○ | ○ | a | 3H |
| Example 10 | 50 | 1.385 | 1.594 | 1.689 | 1.515 | Longitudinal direction | 2.1 | 5.1 | ○ | ○ | 1.45 | 91 | 0.8 | 1.0 | 25 | ○ | ○ | a | 3H |
| Example 11 | 50 | 1.385 | 1.596 | 1.687 | 1.515 | Longitudinal direction | 2.1 | 5.1 | ○ | ○ | 1.45 | 91 | 0.8 | 0.8 | 25 | ○ | ○ | a | 3H |
| Example 12 | 50 | 1.385 | 1.606 | 1.684 | 1.518 | Longitudinal direction | 2.4 | 5.4 | ○ | ○ | 1.48 | 91 | 0.8 | 1.5 | 25 | ○ | ○ | a | 3H |
| Example 13 | 50 | 1.386 | 1.591 | 1.685 | 1.519 | Longitudinal direction | 2.0 | 5.7 | ○ | ○ | 1.48 | 91 | 0.8 | 1.5 | 25 | ○ | ○ | a | 3H |
| Example 14 | 50 | 1.388 | 1.606 | 1.681 | 1.511 | Longitudinal direction | 2.4 | 4.7 | ○ | ○ | 1.43 | 91 | 0.8 | 1.6 | 25 | ○ | ○ | a | 3H |
| Example 15 | 50 | 1.383 | 1.598 | 1.691 | 1.495 | Longitudinal direction | 2.3 | 5.4 | ○ | ○ | 1.27 | 91 | 0.8 | 5.0 | 25 | ○ | ○ | a | 3H |
| Example 16 | 50 | 1.384 | 1.594 | 1.695 | 1.508 | Longitudinal direction | 2.3 | 6.8 | ○ | ○ | 1.26 | 91 | 0.8 | 4.7 | 25 | ○ | ○ | a | 3H |
| Example 17 | 25 | 1.387 | 1.602 | 1.681 | 1.512 | Longitudinal direction | 2.4 | 4.8 | ○ | ○ | 1.47 | 91 | 0.8 | 1.4 | 25 | ○ | ○ | a | 3H |
| Example 18 | 75 | 1.386 | 1.602 | 1.681 | 1.512 | Longitudinal direction | 2.4 | 4.8 | ○ | ○ | 1.47 | 91 | 0.8 | 1.5 | 25 | ○ | ○ | a | 3H |
| Example 19 | 50 | 1.384 | 1.598 | 1.687 | 1.513 | Longitudinal direction | 2.3 | 5.4 | ○ | ○ | 1.48 | 91 | 0.8 | 2.0 | 25 | ○ | ○ | a | 3H |
| Example 20 | 50 | 1.385 | 1.686 | 1.593 | 1.516 | Width | 5.1 | 2.4 | ○ | ○ | 1.48 | 91 | 0.8 | 1.5 | 25 | ○ | ○ | a | 3H |

TABLE 2-continued

| | | | PET film | | | | | | | | | | | | | Laminated film with adhesive layer | | | | Hard coating film | |
|---|---|---|---|---|---|---|---|---|---|---|---|---|---|---|---|---|---|---|---|---|---|
| | Thick-ness (μm) | Density (g/cm³) | Refractive index | | Thick-ness direction | Bending direction | Elastic modulus (GPa) | | Continous bending test at bend radius of 1.5 mm | Continous bending test at bend radius of 0.5 mm | Indentation depth after unloading (μm) | Total light trans-mittance (%) | Haze (%) | Maximum heat shrinkage ratio (%) | Adhesive layer Thickness (μm) | Continous bending test at bend radius of 2.0 mm | Continous bending test at bend radius of 1.0 mm | Hard coating application liquid | Pencil hardness |
| | | | Longi-tudinal direction | Width direction | | | Longi-tudinal direction | Width direction | | | | | | | | | | | |
| Example 21 | 50 | 1.385 | 1.596 | 1.684 | 1.516 | Longitudinal direction | 2.3 | 5.4 | ○ | ○ | 1.48 | 91 | 0.8 | 1.4 | 25 | ○ | ○ | b | 3H |
| Comparative Example 1 | 50 | 1.380 | 1.588 | 1.694 | 1.522 | Longitudinal direction | 2.1 | 5.6 | ○ | × | 1.64 | 91 | 0.8 | 1.4 | 25 | ○ | × | a | 1H |
| Comparative Example 2 | 50 | 1.383 | 1.584 | 1.701 | 1.512 | Longitudinal direction | 2.0 | 7.5 | ○ | × | 1.56 | 91 | 0.8 | 3.7 | 25 | ○ | × | a | 2H |
| Comparative Example 3 | 50 | 1.381 | 1.601 | 1.684 | 1.524 | Longitudinal direction | 2.3 | 5.4 | ○ | ○ | 1.60 | 91 | 0.8 | 1.8 | 25 | ○ | ○ | a | 2H |
| Comparative Example 4 | 25 | 1.381 | 1.591 | 1.676 | 1.530 | Longitudinal direction | 2.3 | 5.4 | × | ○ | 1.62 | 91 | 0.8 | 1.8 | 25 | × | ○ | a | 2H |
| Comparative Example 5 | 75 | 1.381 | 1.623 | 1.690 | 1.526 | Longitudinal direction | 2.3 | 5.4 | ○ | ○ | 1.63 | 91 | 0.8 | 1.8 | 25 | ○ | ○ | a | 2H |
| Comparative Example 6 | 50 | 1.382 | 1.598 | 1.682 | 1.524 | Longitudinal direction | 2.1 | 5.1 | ○ | ○ | 1.66 | 91 | 0.8 | 1.8 | 25 | ○ | ○ | a | 2H |
| Comparative Example 7 | 50 | 1.380 | 1.603 | 1.686 | 1.522 | Longitudinal direction | 2.4 | 5.6 | ○ | ○ | 1.56 | 91 | 0.8 | 1.8 | 25 | ○ | ○ | a | 2H |
| Comparative Example 8 | 50 | 1.398 | 1.631 | 1.686 | 1.500 | Longitudinal direction | 3.2 | 3.9 | × | ○ | 1.46 | 91 | 0.8 | 1.5 | 25 | × | ○ | a | 3H |
| Comparative Example 9 | 50 | 1.396 | 1.650 | 1.669 | 1.496 | Longitudinal direction | 3.4 | 4.3 | × | ○ | 1.36 | 91 | 0.8 | 1.0 | 25 | × | ○ | a | 3H |
| Comparative Example 10 | 50 | 1.364 | 1.578 | 1.660 | 1.532 | Longitudinal direction | 2.4 | 6.3 | ○ | ○ | 1.56 | 91 | 0.8 | 6.3 | 25 | ○ | ○ | a | 2H |
| Comparative Example 11 | 50 | 1.385 | 1.589 | 1.685 | 1.525 | Longitudinal direction | 2.0 | 5.7 | ○ | × | 1.55 | 91 | 0.8 | 1.5 | 25 | ○ | × | a | 2H |
| Comparative Example 12 | 50 | 1.384 | 1.596 | 1.679 | 1.526 | Longitudinal direction | 2.5 | 4.0 | ○ | ○ | 1.55 | 91 | 0.8 | 1.4 | 25 | ○ | ○ | a | 2H |

INDUSTRIAL APPLICABILITY

While maintaining mass productivity, the foldable display using the laminated film for protecting an organic EL module of a foldable display of the present invention does not undergo deformation after the laminated film positioned on the surface of the organic EL module is repeatedly folded, and hence does not cause image distortion in the folding portion of the display. In particular, the mobile device or the image display apparatus including the foldable display using the laminated film of the present invention as the protective film of the organic EL module provides an beautiful image, is rich in functionality, and is excellent in convenience, such as portability.

EXPLANATION OF REFERENCE NUMERALS

1: foldable display
11: bend radius
2: polyester film included in laminated film for protecting organic EL module of foldable display
21: folding portion
22: bending direction (direction orthogonal to folding portion)
3: organic EL module
30: polyester film
31: adhesive layer
32: back-surface substrate
33: thin-film transistor
34: organic EL element
35: encapsulating adhesive layer
36: laminated film

The invention claimed is:

1. A polyester film for protecting an organic EL module of a foldable display, the polyester film satisfying the following conditions:
   (1) a refractive index in a bending direction is from 1.591 to 1.606;
   (2) a refractive index in a folding portion direction is from 1.670 to 1.700;
   (3) a refractive index in a thickness direction is 1.520 or less; and
   (4) a density is 1.380 g/cm$^3$ or more,
   wherein the bending direction refers to a direction orthogonal to a folding portion of the polyester film at a time when the polyester film is folded,
   wherein the polyester film is a biaxially stretched polyethylene terephthalate film,
   wherein the polyester film comprises an easy-to-adhere layer on at least one surface thereof and a hard coating layer having a thickness of from 1 μm to 50 μm, and
   wherein the hard coating layer is present on the easy-to-adhere layer on at least one surface of the polyester film.

2. The polyester film for protecting an organic EL module of a foldable display according to claim 1, wherein the polyester film has an elastic modulus in the bending direction of 2.7 GPa or less, and an elastic modulus in the folding portion direction of 4.5 GPa or more.

3. The polyester film for protecting an organic EL module of a foldable display according to claim 1, wherein the polyester film has a total light transmittance of 85% or more, a haze of 3% or less, and a maximum heat shrinkage ratio of 6% or less.

4. A laminated film for protecting an organic EL module of a foldable display, the laminated film comprising:
   the polyester film of claim 1; and
   an adhesive layer on at least one surface of the polyester film.

5. The laminated film for protecting an organic EL module of a foldable display according to claim 4, wherein the adhesive layer has a thickness of from 1 μm to 50 μm.

6. A foldable display comprising the polyester film for protecting an organic EL module of a foldable display of claim 1 as a protective film of an organic EL module, wherein the protective film of the organic EL module is a single film continuous across a folding portion of the foldable display.

7. A foldable display comprising the laminated film for protecting an organic EL module of a foldable display of claim 4 as a protective film of an organic EL module, wherein the protective film of the organic EL module is a single film continuous across a folding portion of the foldable display.

8. A mobile device comprising the foldable display of claim 6.

9. A mobile device comprising the foldable display of claim 7.

10. The polyester film for protecting an organic EL module of a foldable display according to claim 1, wherein the easy-to-adhere layer is applied in an amount from 0.005 g/m$^2$ to 0.20 g/m$^2$.

11. The polyester film for protecting an organic EL module of a foldable display according to claim 1, wherein the easy-to-adhere layer comprises at least one water-soluble or water-dispersible resin selected from the group consisting of a polyester-based resin, a polyether polyurethane-based resin, a polyester polyurethane resin, a polycarbonate polyurethane resin, and an acrylic resin.

12. The polyester film for protecting an organic EL module of a foldable display according to claim 1, wherein the easy-to-adhere layer comprises at least one water-soluble or water-dispersible compound selected from the group consisting of a melamine compound, an isocyanate compound, an oxazoline compound, an epoxy compound, and a carbodiimide compound.

13. The polyester film for protecting an organic EL module of a foldable display according to claim 1, wherein the easy-to-adhere layer comprises fine particles with an average particle diameter of 2 μm or less.

14. The polyester film for protecting an organic EL module of a foldable display according to claim 13, wherein the fine particles are at least one member selected from the group consisting of titanium dioxide, barium sulfate, calcium carbonate, calcium sulfate, silica, alumina, talc, kaolin, clay, calcium phosphate, mica, hectorite, zirconia, tungsten oxide, lithium fluoride, calcium fluoride, styrene-based particles, acrylic particles, melamine-based particles, benzoguanamine-based particles, and silicone-based particles.

15. The polyester film for protecting an organic EL module of a foldable display according to claim 1, wherein the hard coating layer comprises at least one member selected from the group consisting of an acrylic resin, a siloxane-based resin, an inorganic hybrid-based resin, a urethane acrylate-based resin, a polyester acrylate-based resin, and an epoxy-based resin.

16. A foldable display comprising a polarizer and the polyester film for protecting an organic EL module of a foldable display of claim 1 as a protective film of an organic EL module, wherein the polyester film is provided on at least the visible side surface of the polarizer and the slow axial direction of the polyester film is in the range of 0°±10° or 90°±10° with the absorption axis direction of the polarizer.

* * * * *